(12) United States Patent
Son et al.

(10) Patent No.: US 11,038,264 B2
(45) Date of Patent: Jun. 15, 2021

(54) DISPLAY ASSEMBLY INCLUDING ANTENNA AND ELECTRONIC DEVICE INCLUDING THE SAME

(71) Applicant: Samsung Electronics Co., Ltd., Gyeonggi-do (KR)

(72) Inventors: Dongil Son, Gyeonggi-do (KR); Hyungsup Byeon, Gyeonggi-do (KR); Chihyun Cho, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/513,232

(22) Filed: Jul. 16, 2019

(65) Prior Publication Data

US 2020/0021016 A1 Jan. 16, 2020

(30) Foreign Application Priority Data

Jul. 16, 2018 (KR) ........................ 10-2018-0082492

(51) Int. Cl.
| | |
|---|---|
| *H01Q 1/38* | (2006.01) |
| *H01Q 1/48* | (2006.01) |
| *H01Q 21/06* | (2006.01) |
| *H05K 5/00* | (2006.01) |
| *H05K 7/20* | (2006.01) |
| *H01Q 1/22* | (2006.01) |

(52) U.S. Cl.
CPC ................. *H01Q 1/38* (2013.01); *H01Q 1/48* (2013.01); *H01Q 21/062* (2013.01); *H01Q 21/065* (2013.01); *H05K 5/0017* (2013.01); *H05K 7/20963* (2013.01); *H01Q 1/2291* (2013.01)

(58) Field of Classification Search
CPC .......... H01Q 1/38; H01Q 1/48; H01Q 1/2291; H01Q 21/062; H01Q 21/065; H05K 1/0209; H05K 7/0017; H05K 7/20963
See application file for complete search history.

(56) References Cited

U.S. PATENT DOCUMENTS 6,825,811 B2 * 11/2004 Iwai .................... H01Q 9/0421
343/702
2012/0050114 A1 3/2012 Li et al.
(Continued)

FOREIGN PATENT DOCUMENTS

| CN | 102437405 | 5/2012 |
|---|---|---|
| CN | 103384026 | 11/2013 |

(Continued)

OTHER PUBLICATIONS

International Search Report dated Oct. 18, 2019 issued in counterpart application No. PCT/KR2019/008761, 10 pages.
(Continued)

*Primary Examiner* — Seokjin Kim
(74) *Attorney, Agent, or Firm* — The Farrell Law Firm, P.C.

(57) ABSTRACT

A display assembly and electronic device are provided. The display assembly includes a display panel including one or more display pixels, a substrate electrically connected with the one or more display pixels and including a first area including at least one of layer of the display panel and a second area extending from the first area to an outside of the display panel, and an antenna configured to be formed in at least part of the second area of the substrate.

15 Claims, 18 Drawing Sheets

(56) References Cited

U.S. PATENT DOCUMENTS

| | | | |
|---|---|---|---|
| 2013/0093631 A1* | 4/2013 | Kodama | H01Q 9/0407 |
| | | | 343/702 |
| 2013/0293424 A1 | 11/2013 | Zhu et al. | |
| 2013/0299789 A1 | 11/2013 | Yamazaki et al. | |
| 2014/0112511 A1 | 4/2014 | Corbin et al. | |
| 2014/0266974 A1* | 9/2014 | Sharawi | H01Q 1/48 |
| | | | 343/893 |
| 2016/0270211 A1 | 9/2016 | Yosui | |
| 2016/0308563 A1 | 10/2016 | Ouyang et al. | |
| 2017/0110787 A1 | 4/2017 | Ouyang et al. | |
| 2017/0228091 A1 | 8/2017 | Ogita | |
| 2017/0309992 A1 | 10/2017 | Noori et al. | |
| 2017/0371190 A1 | 12/2017 | Yamazaki et al. | |
| 2018/0011447 A1 | 1/2018 | Yoshizumi et al. | |
| 2018/0026341 A1* | 1/2018 | Mow | H04B 10/90 |
| | | | 343/702 |
| 2018/0035528 A1 | 2/2018 | Kim et al. | |
| 2019/0165450 A1* | 5/2019 | Ji | H01Q 15/008 |
| 2019/0303640 A1 | 10/2019 | Song et al. | |

FOREIGN PATENT DOCUMENTS

| | | |
|---|---|---|
| CN | 207115247 | 3/2018 |
| CN | 207459171 | 6/2018 |
| EP | 2 424 034 | 2/2012 |
| JP | 2014-197522 | 10/2014 |
| JP | 5943168 | 6/2016 |
| JP | 2018-013477 | 1/2018 |

OTHER PUBLICATIONS

European Search Report dated Nov. 25, 2019 issued in counterpart application No. 19186636.7-1205, 13 pages.

Chinese Office Action dated Mar. 29, 2021 issued in counterpart application No. 201980016396.X, 20 pages.

* cited by examiner

DISPLAY ASSEMBLY INCLUDING ANTENNA AND ELECTRONIC DEVICE INCLUDING THE SAME

CROSS-REFERENCE TO RELATED APPLICATION(S)

This application is based on and claims priority under 35 U.S.C. 119 to Korean Patent Application Serial No. 10-2018-0082492, filed on Jul. 16, 2018, in the Korean Intellectual Property Office, the entire disclosure of which is incorporated herein by reference.

BACKGROUND

1. Field

The present disclosure relates generally to a display assembly including an antenna and an electronic device including the display assembly.

2. Description of Related Art

Electronic devices may output stored information as sound or images. As electronic devices have become highly integrated and high-speed, high-volume wireless communication has become commonplace, and electronic devices, such as mobile communication terminals, are being equipped with various functions. For example, an electronic device comes with integrated functionalities, including an entertainment function, such as playing video games, a multimedia function, such as replaying music/videos, a communication and security function for mobile banking, and a scheduling or e-wallet function. Various circuit parts are mounted on the circuit board of the electronic device to provide integrated functions. Thus, efficient mounting becomes more important.

In order to meet demand for soaring wireless data traffic since the 4G communication system came on the market, there are ongoing efforts to develop next-generation communication systems (e.g., 5G communication systems or pre-5G communication systems). For higher data rates, next-generation communication systems adopt ultra-high frequency bands of a few tens of GHz (e.g., 6 GHz or more and 300 GHz or less), such as those of millimeter wave (mmWave). To mitigate pathloss on the ultra-high frequency band and increase the reach of radio waves, the following techniques are taken into account for the next-generation communication system: beamforming, massive multi-input multi-output (MIMO), full dimensional MIMO (FD-MIMO), array antenna, analog beamforming, and large scale antenna.

To mount a communication device or other various circuit parts in an electronic device, the circuit board on which the circuit parts are mounted may be enlarged or the circuit parts may be stacked one over another. Antenna structures used for next-generation telecommunication (e.g., mmWave communication) may be influenced by the ambient environment due to their high-frequency characteristics. Next-generation communication antennas, despite having the same structure, may exhibit different performances depending on the actual installation environment.

SUMMARY

The present disclosure has been made to address at least the disadvantages described above and to provide at least the advantages described below.

In accordance with an aspect of the present disclosure, a display assembly is provided. The display assembly includes a display panel including one or more display pixels, a substrate electrically connected with the one or more display pixels and including a first area including at least one of layer of the display panel and a second area extending from the first area to an outside of the display panel, and an antenna configured to be formed in at least part of the second area of the substrate.

In accordance with an aspect of the present disclosure, an electronic device is provided. The electronic device includes a display panel including one or more display pixels, a substrate electrically connected with the one or more display pixels and including a first area including at least one of layer of the display panel and a second area extending from the first area to an outside of the display panel, an antenna configured to be formed in at least part of the second area of the substrate, and a communication circuit electrically connected with the antenna.

In accordance with an aspect of the present disclosure, an electronic device is provided. The electronic device includes a display panel including one or more display pixels, a transparent plate including an active area configured to provide a user with an image and/or a video through the display panel and an inactive area extending to a surrounding of the active area, a substrate including a first area connected with at least part of the display panel and a second area extending from the first area to an outside of the display panel, and an antenna disposed in at least part of the second area of the substrate. The antenna disposed in the second area overlaps at least part of the inactive area.

According to various embodiments of the disclosure, a communication device with an antenna may be mounted using a board part mounted in a display assembly. A degree of freedom may be secured for mounting space by eliminating the board structure which is added on one side of the main board for the antenna.

According to various embodiments of the disclosure, the board part mounted in the display assembly may be extended or bent and a communication device may be mounted on the surfaces of the circuit board which may face in various directions.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1:
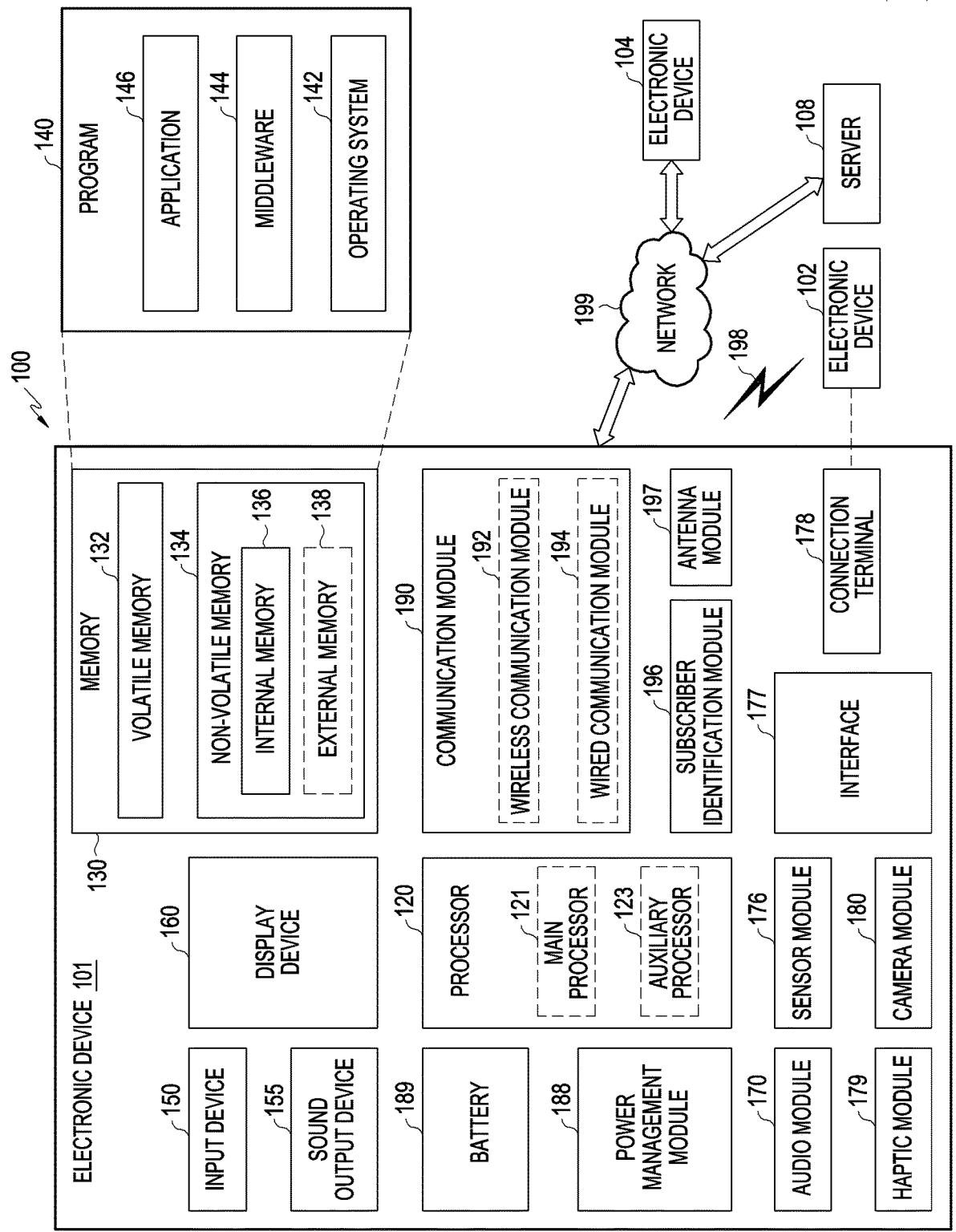
FIG. 1 is a diagram of an electronic device in a network environment, according to an embodiment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network) or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing recordings, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 1801 and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device). According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, instructions or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
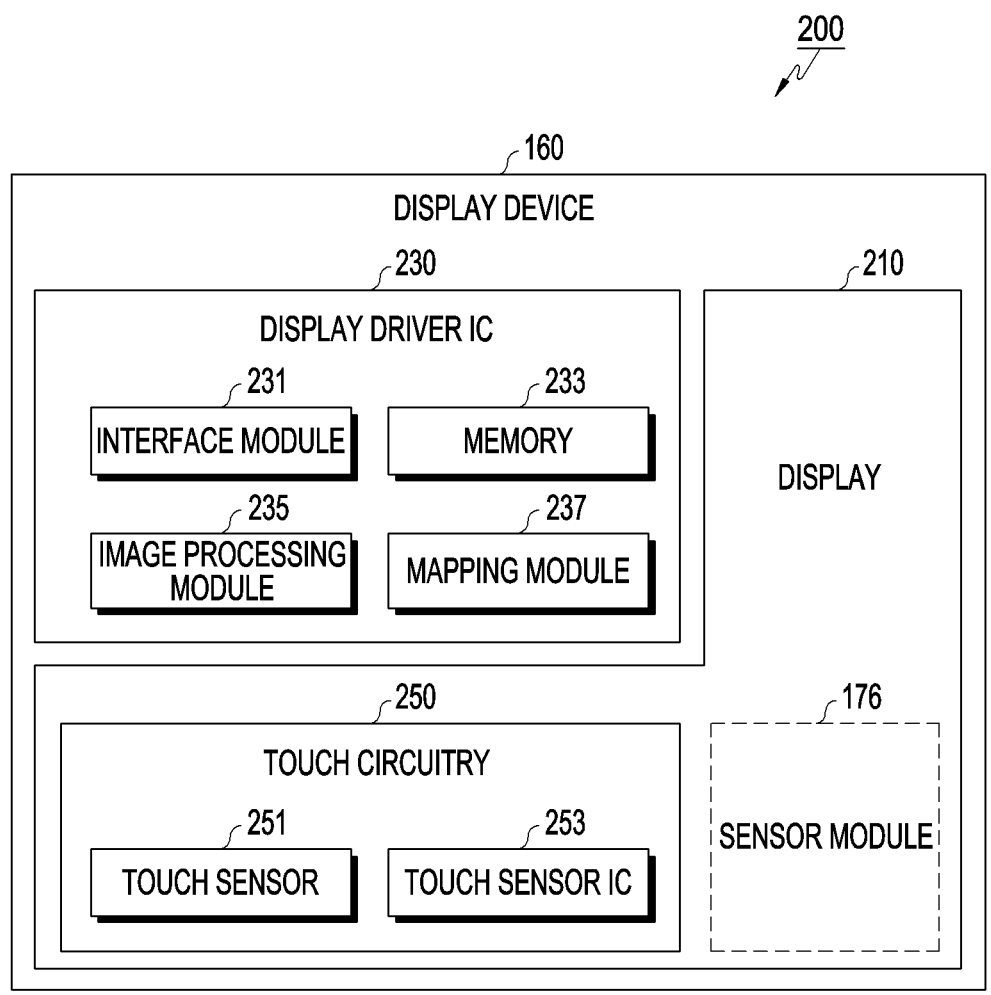
FIG. 2 is a diagram of a display device, according to an embodiment.

FIG. 2 is a diagram 200 of the display device 160, according to an embodiment. Referring to FIG. 2, the display device 160 may include a display 210 and a display driver integrated circuit (DDI) 230 to control the display 110. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. The image information may be received from the processor 120 (e.g., the main processor 121 (e.g., an AP)) or the auxiliary processor 123 (e.g., a GPU) operated independently from the function of the main processor 121. The DDI 230 may communicate with touch circuitry 250 or the sensor module 176 via the interface module 231. The DDI 230 may also store at least part of the received image information in the memory 233 on a frame by frame basis. The image processing module 235 may perform pre-processing or post-processing (e.g., adjustment of resolution, brightness, or size) with respect to at least part of the image data. The pre-processing or post-processing may be performed based at least in part on one or more characteristics of the image data or one or more characteristics of the display 210. The mapping module 237 may generate a voltage value or a current value corresponding to the image data pre-processed or post-processed by the image processing module 135. The generating of the voltage value or current value may be performed, for example, based at least in part on one or more attributes of the pixels (e.g., an array, such as an RGB stripe or a pentile structure, of the pixels, or the size of each subpixel) of the display 210. At least some pixels of the display 210 may be driven based at least in part on the voltage value or the current value such that visual information (e.g., a text, an image, or an icon) corresponding to the image data may be displayed via the display 210.

The display device 160 may further include the touch circuitry 250. The touch circuitry 250 may include a touch sensor 251 and a touch sensor IC 253 to control the touch sensor 151. The touch sensor IC 253 may control the touch sensor 251 to sense a touch input or a hovering input with respect to a certain position on the display 210. To achieve this the touch sensor IC 253 may detect (e.g., measure) a change in a signal (e.g., a voltage, a quantity of light, a resistance, or a quantity of one or more electric charges) corresponding to the certain position on the display 210. The touch sensor IC 253 may provide input information (e.g., a position, an area, a pressure, or a time) indicative of the touch input or the hovering input detected to the processor 120. At least part (e.g., the touch sensor IC 253) of the touch circuitry 250 may be formed as part of the display 210 or the DDI 230, or as part of another component (e.g., the auxiliary processor 123) disposed outside the display device 160.

The display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250) of the display device 160. When the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. When the sensor module 176 embedded in the display device 160 includes a pressure sensor, the pressure sensor may obtain pressure information corresponding to a touch input received via a partial or whole area of the display 210. The touch sensor 251 or the sensor module 176 may be disposed between pixels in a pixel layer of the display 210, or over or under the pixel layer.

Figure 3:
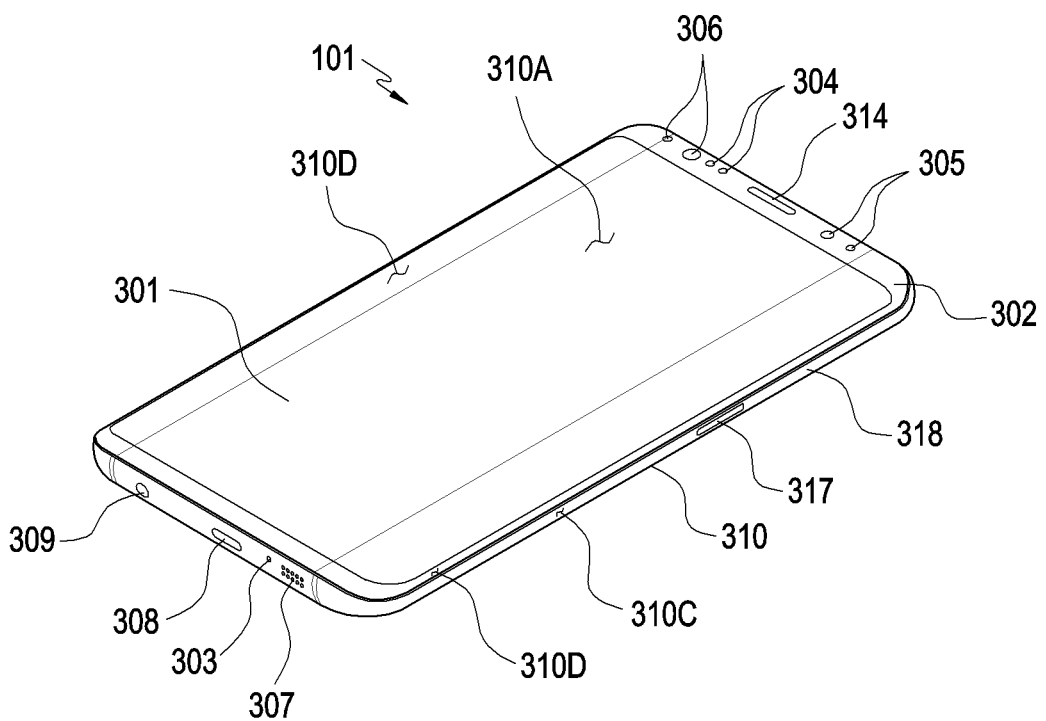
FIG. 3 is a diagram of an electronic device, according to an embodiment.
Figure 4:
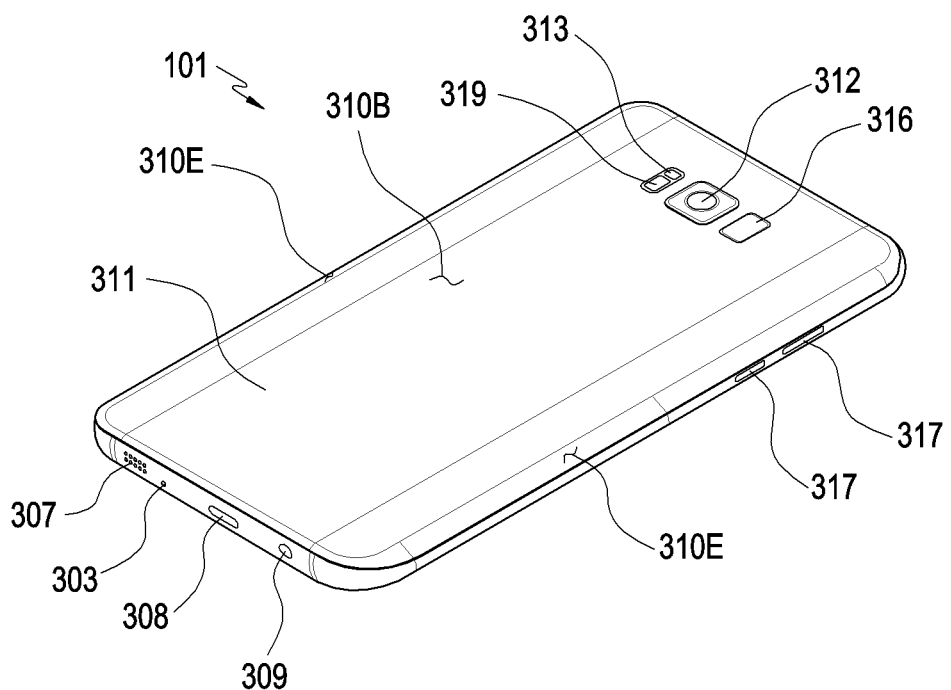
FIG. 4 is a diagram of an electronic device, according to an embodiment.

FIG. 3 is a diagram of an electronic device 101, according to an embodiment. FIG. 4 is a diagram of an electronic device 101, according to an embodiment.

Referring to FIGS. 3 and 4, an electronic device 101 may include a housing 310 with a first (or front) surface 310A, a second (or rear) surface 310B, and a side surface 310C surrounding a space between the first surface 310A and the second surface 310B. The housing may denote a structure forming part of the first surface 310A, the second surface 310B, and the side surface 310C of FIG. 3. At least part of the first surface 310A may have a substantially transparent front plate 302 (e.g., a glass plate or polymer plate including various coat layers). The second surface 310B may be formed of a substantially opaque rear plate 311. The rear plate 311 may be formed of laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. The rear plate 311 and the side bezel plate 318 may be integrally formed together and include the same material (e.g., a metal, such as aluminum).

The front plate 302 may include two first regions 310D, which seamlessly and bendingly extend from the first surface 310A to the rear plate 311, on both the long edges of the front plate 302. The rear plate 311 may include second regions 310E, which seamlessly and bendingly extend from the second surface 310B to the front plate, on both the long edges. The front plate 302 (or the rear plate 311) may include only one of the first regions 310 (or the second regions 310E). Alternatively, the first regions 310D or the second regions 301E may partially be excluded. At a side view of the electronic device 101, the side bezel structure 318 may have a first thickness (or width) for sides that do not have the first regions 310D or the second regions 310E and a second thickness, which is smaller than the first thickness, for sides that have the first regions 310D or the second regions 310E.

The electronic device 101 may include at least one or more of a display 301, audio modules 303, 307, and 314, sensor modules 304, 316, and 319, camera modules 305, 312, and 313, key input devices 317, a light emitting device 306, and connector holes 308 and 309. The electronic device 101 may exclude at least one (e.g., the key input device 317 or the light emitting device 306) component or may add other components.

The display 301 may be exposed through the top of the front plate 302. At least a portion of the display 301 may be exposed through the front plate 302 forming the first surface 310A and the first regions 310D of the side surface 310C. The edge of the display 301 may be formed to be substantially the same in shape as an adjacent outer edge of the front plate 302. The interval between the outer edge of the display 301 and the outer edge of the front plate 302 may remain substantially even to give a larger area of exposure the display 301.

The screen display region of the display 301 may have a recess or opening in a portion thereof, and at least one or more of the audio module 314, sensor module 304, camera module 305, and light emitting device 306 may be aligned with the recess or opening. At least one or more of the audio module 314, sensor module 304, camera module 305, fingerprint sensor 316, and light emitting device 306 may be included on the rear surface of the screen display region of the display 301. The display 301 may be disposed to be coupled with, or adjacent, a touch detecting circuit, a pressure sensor capable of measuring the strength (pressure) of touches, and/or a digitizer for detecting a magnetic field-type stylus pen. At least part of the sensor modules 304 and 519 and/or at least part of the key input device 317 may be disposed in the first regions 310D and/or the second regions 310E.

The audio modules 303, 307, and 314 may include a microphone hole 303 and speaker holes 307 and 314. The microphone hole 303 may have a microphone inside to obtain external sounds. There may be a plurality of microphones to be able to detect the direction of a sound. The speaker holes 307 and 314 may include an external speaker hole 307 and a phone receiver hole 314. The speaker holes 307 and 314 and the microphone hole 303 may be implemented as a single hole, or speakers may be rested without the speaker holes 307 and 314 (e.g., piezo speakers).

The sensor modules 304, 316, and 319 may generate an electrical signal or data value corresponding to an internal operating state or external environmental state of the electronic device 101. The sensor modules 304, 316, and 319 may include a first sensor module 304 (e.g., a proximity sensor) and/or a second sensor module (e.g., a fingerprint sensor) disposed on the first surface 310A of the housing 310 and/or a third sensor module 319 (e.g., a heart-rate monitor (HRM) sensor) and/or a fourth sensor module 316 (e.g., a fingerprint sensor) disposed on the second surface 310B of the housing 310. The fingerprint sensor may be disposed on the second surface 310B as well as on the first surface 310A (e.g., the display 301) of the housing 310. The electronic device 101 may further include sensor modules (e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 304).

The camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an image signal processor. The flash 313 may include a light emitting diode (LED) or a xenon lamp. Two or more lenses (an infrared (IR) camera, a wide-angle lens, and a telescopic lens) and image sensors may be disposed on one surface of the electronic device 101.

The key input device 317 may be disposed on the side surface 310C of the housing 310. The electronic device 101 may exclude all or some of the above-mentioned key input devices 317 and the excluded key input devices 317 may be implemented in other forms (e.g., as soft keys) on the display 301. The key input device may include the sensor module 316 disposed on the second surface 310B of the housing 310.

The light emitting device 306 may be disposed on the first surface 310A of the housing 310. The light emitting device 306 may provide information about the state of the electronic device 101 in the form of light. The light emitting device 306 may provide a light source that interacts with the camera module 305. The light emitting device 306 may include a LED, an IR LED, or a xenon lamp.

The connector holes 308 and 309 may include a first connector hole 308 for receiving a connector (e.g., a USB connector) for transmitting or receiving power and/or data to/from an external electronic device and/or a second connector hole 309 (e.g., an earphone jack) for receiving a connector for transmitting or receiving audio signals to/from the external electronic device.

Figure 5:
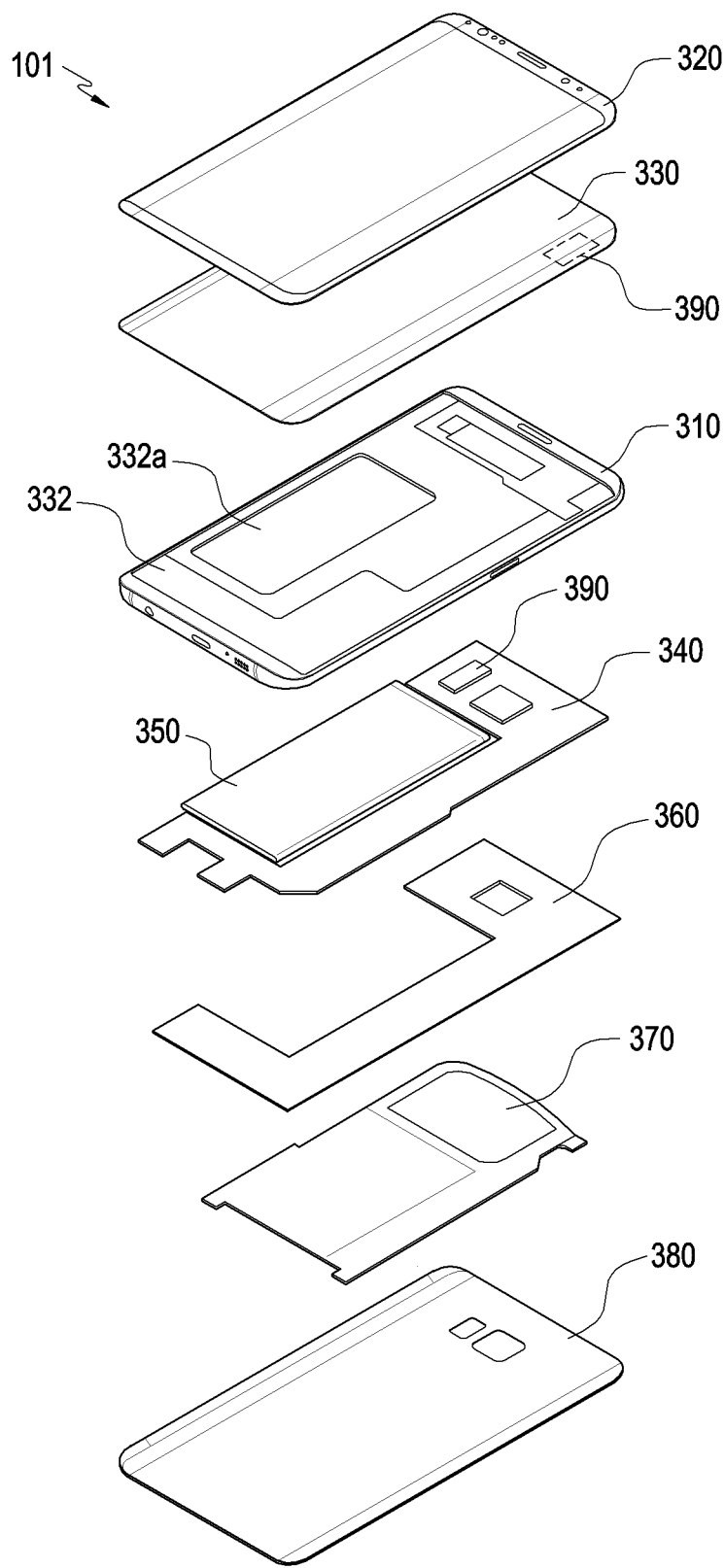
FIG. 5 is a diagram of an electronic device, according to an embodiment.

FIG. 5 is a diagram of an electronic device 101, according to an embodiment.

Referring to FIG. 5, an electronic device 101 may include a side bezel structure 331, a first supporting member 332 (e.g., a bracket), a front plate 320, a display 330, a printed circuit board (PCB) 340, a battery 350, a second supporting member 360 (e.g., a rear case), an antenna 370, and a rear plate 380. The electronic device 101 may exclude at least one (e.g., the first supporting member 332 or the second supporting member 360) component or may add other components. At least one of the components of the electronic device 101 may be the same or similar to at least one of the components of the electronic device 101 of FIG. 3 or 4 and no duplicate description is made below.

The first supporting member 332 may be disposed inside the electronic device 101 to be connected with the side bezel structure 331 or integrated with the side bezel structure 331. The first supporting member 332 may be formed of a metal and/or non-metallic material (e.g., polymer). The display 330 may be joined onto one surface of the first supporting member 332, and the printed circuit board 340 may be joined onto the opposite surface of the first supporting member 311. A processor, memory, and/or interface may be mounted on the printed circuit board 340. The processor may include one or more of a CPU, an AP, a GPU, an ISP, a sensor hub processor, or a CP.

The memory may include a volatile or non-volatile memory.

The interface may include an HDMI, USB interface, an SD card interface, and/or an audio interface. The interface may electrically or physically connect the electronic device 101 with an external electronic device and may include a USB connector, an SD card/multi-media card (MMC) connector, or an audio connector.

The battery 350 may be a device for supplying power to at least one component of the electronic device 101. The battery 189 may include a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

The antenna 370 may be disposed between the rear plate 380 and the battery 350. The antenna 370 may include, e.g., a near-field communication (NFC) antenna, a wireless charging antenna, and/or a magnetic secure transmission (MST) antenna. The antenna 370 may perform short-range communication with an external device or may wirelessly transmit or receive power necessary for charging. An antenna structure may be formed by a portion or combination of the side bezel structure 331 and/or the first supporting member 332.

The electronic device may include a plurality of communication devices 390. Some of the plurality of communication devices 390 may be implemented to transmit or receive radio waves with different characteristics (referred to as radio waves of frequency bands A and B) to implement MIMO. Some of the plurality of communication devices 390 may be configured to simultaneously transmit or receive radio waves with the same characteristic (referred to as radio waves of frequencies A1 and A2 in frequency band A) to implement diversity. Some of the plurality of communication devices 390 may be configured to simultaneously transmit or receive radio waves with the same characteristic (referred to as radio waves of frequencies B1 and B2 in frequency band B) to implement diversity. Two communication devices may be included. Alternatively, the electronic device 101 may include four communication devices to implement both MIMO and diversity.

Given the transmission and reception nature of radio waves, when one communication device is disposed in a first position of the printed circuit board 340, another communication device may be disposed in a second position, which is separated from the first position, of the display assembly 330, but not on the printed circuit board 340. One communication device and another communication device may be disposed considering the distance therebetween depending on diversity characteristics.

At least one communication device 390 may include a wireless communication circuit to process radio waves transmitted or received in an ultra-high frequency band (e.g., about 6 GHz or more and about 300 GHz or less). The radiating conductor (e.g., the antenna 651 of FIG. 8) of the at least one communication device 390 may be formed of a dipole-structure radiating conductor extending in one direction or a patch-type radiating conductor and a plurality of radiating conductors may be arrayed to form an antenna array. A chip (e.g., an integrated circuit (IC) chip) in which part of the wireless communication circuit is implemented may be disposed on the opposite surface of the surface where the radiating conductors are disposed or on one side of the area where the radiating conductors are disposed and may be electrically connected with the radiating conductor (s) via lines which are formed of a printed circuit pattern.

Figure 6:
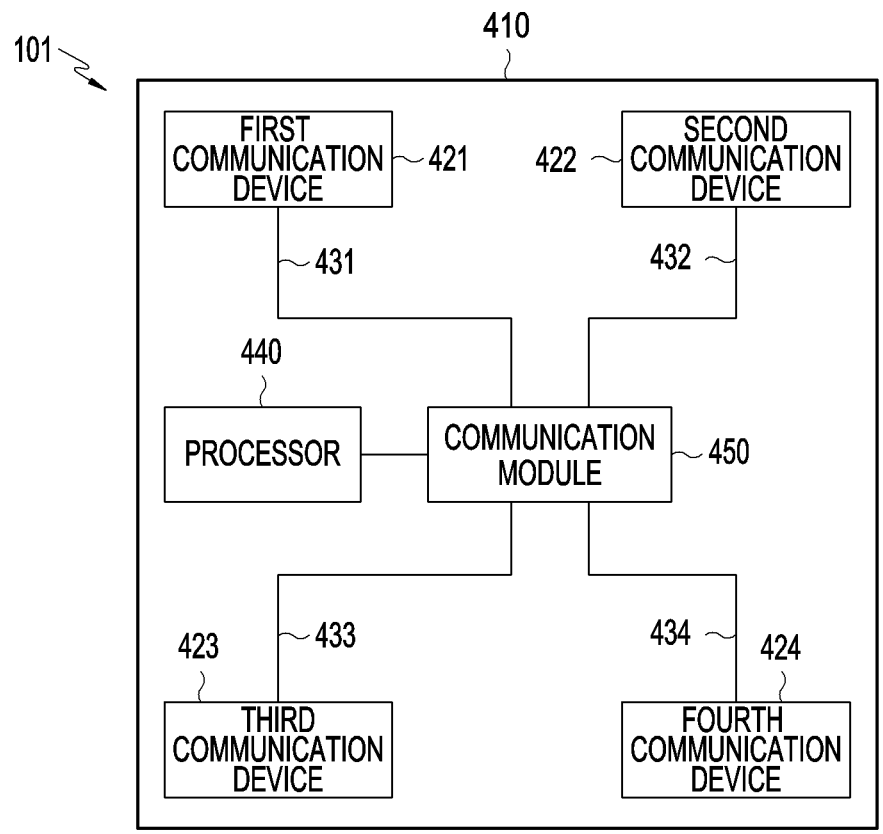
FIG. 6 is a diagram of an example electronic device supporting 5G communication, according to an embodiment.

FIG. 6 is a diagram of an example electronic device 101 supporting 5G communication, according to an embodiment.

Referring to FIG. 6, an electronic device 101 may include a housing 410, a processor 440, a communication module 450, a first communication device 421, a second communication device 422, a third communication device 423, a fourth communication device 424, a first conducting line 431, a second conducting line 432, a third conducting line 433, or a fourth conducting line 434.

The housing 410 may include the other components of the electronic device 101. The housing 410 may include a front plate, a back plate facing away from the front plate, and a side member (or metal frame) attached to the back plate or integrally formed with the back plate and surrounding the space between the front plate and the rear plate.

The electronic device 101 may include at least one communication device. The electronic device 101 may include at least one of the first communication device 421, the second communication device 422, the third communication device 423, or the fourth communication device 424.

The first communication device 421, the second communication device 422, the third communication device 423, or the fourth communication device 424 may be positioned inside the housing 410. When viewed from above the back plate of the electronic device, the first communication device 421 may be disposed at a top left end of the electronic device 101, the second communication device 422 at a top right end of the electronic device 101, the third communication device 423 at a bottom left end of the electronic device 101, and the fourth communication device 424 at a bottom right end of the electronic device 101.

The processor 440 may include one or more of a CPU, an AP, a GPU, a camera ISP, or a baseband processor (or CP). The processor 440 may be implemented in a system-on-chip (SoC) or system-in-package (SiP).

The communication module 450 may be electrically connected with at least one communication device using at least one conducting line. The communication module 450 may be electrically connected with the first communication device 421, the second communication device 422, the third communication device 423, or the fourth communication device 424 using the first conducting line 431, the second conducting line 432, the third conducting line 433, or the fourth conducting line 434. The communication module 450 may include a baseband processor or at least one communication circuit (e.g., intermediate frequency integrated circuit (IFIC) or radio frequency integrated circuit (RFIC)). The communication module 450 may include a baseband processor separate from the processor 440 (e.g., AP). The first conducting line 431, the second conducting line 432, the third conducting line 433, or the fourth conducting line 434 may include a coaxial cable or flexible printed circuit board (FPCB).

The communication module 450 may include a first baseband processor (BP) or a second BP. The electronic device 101 may further include one or more interfaces to support inter-chip communication between the first BP (or second BP) and the processor 440. The processor 440 and the first BP or second BP may transmit or receive data using the inter-chip interface (e.g., an inter-processor communication channel).

The first BP or second BP may provide an interface for performing communication with other entities. The first BP may support wireless communication on a first network. The second BP may support wireless communication on a second network.

The first BP or second BP, together with the processor 440, may form one module. The first BP or second BP may be integrally formed with the processor 440. The first BP or second BP may be disposed in a single chip or formed as an independent chip. The processor 440 and at least one baseband processor (e.g., the first BP) may be integrally formed in one chip (e.g., an SoC chip), and the other baseband processor (e.g., the second BP) may be formed as an independent chip.

The first network or the second network may correspond to the network 199 of FIG. 1. The first network and the second network may include a 4G network and a 5G network, respectively. The 4G network may support a long term evolution (LTE) protocol specified by the 3GPP. The 5G network may support a new radio (NR) protocol specified by the 3GPP.

Figure 7:
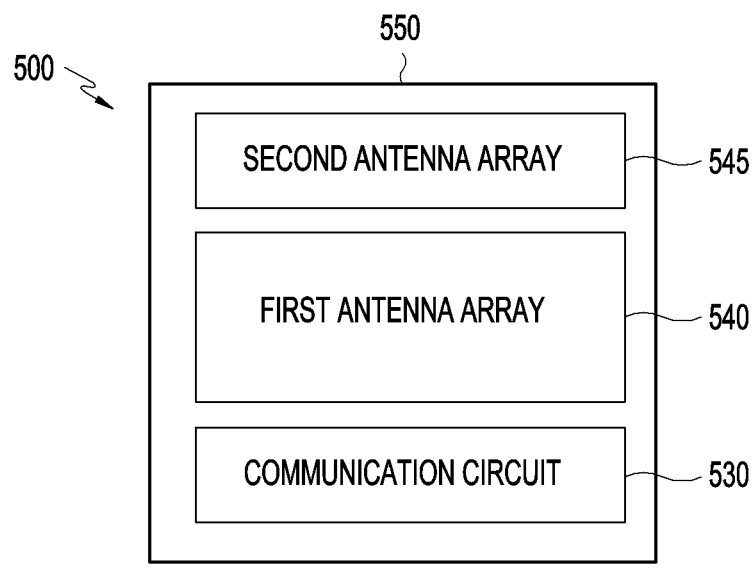
FIG. 7 is a diagram of a communication device, according to an embodiment.

FIG. 7 is a diagram of a communication device, according to an embodiment.

Referring to FIG. 7, a communication device 500 may include a communication circuit 530 (e.g., an RFIC), a display assembly 550, a first antenna array 540, or a second antenna array 545.

The communication circuit 530, the first antenna array 540, or the second antenna array 545 may be positioned on one side of the display assembly 550. The first antenna array 540 or the second antenna array 545 may be disposed on a first surface of the board disposed in the display assembly 550, and the communication circuit 530 may be positioned on a second surface of the board disposed in the display assembly 550. The display assembly 550 may include a connector (e.g., a coaxial cable connector or board-to-board (B-to-B)) for electrically connecting with other PCB (e.g., the PCB where the communication module 450 is disposed in FIG. 5) using a transmission line (e.g., the first conducting line 431 of FIG. 5 or a coaxial cable). The display assembly 550 may connect, via a coaxial cable, to the PCB where the communication module 450 is disposed using, a coaxial cable connector, and the coaxial cable may be used to transmit or receive intermediate frequency (IF) signals or radio frequency (RF) signals. Power or other control signals may be transferred via a B-to-B connector.

The first antenna array 540 or the second antenna array 545 may include a plurality of antennas. The antennas may include patch antennas, loop antennas, or dipole antennas. The plurality of antennas included in the first antenna array 540 may be patch antennas to form a beam towards the back plate of the electronic device. The plurality of antennas included in the second antenna array 545 may be dipole antennas or loop antennas to form a beam towards the side member of the electronic device.

The communication circuit 530 may support at least part (e.g., 24 GHz to 30 GHz or 37 GHz to 40 GHz) of the 6 GHz-300 GHz band. The communication circuit 530 may up-convert or down-convert frequencies. The communication circuit 530 included in the communication device 500 may up-convert IF signals received from a communication module through a conducting line into RF signals. The communication circuit 530 included in the communication device 500 may down-convert RF signals (e.g., mmWave signals) received through the first antenna array 540 or second antenna array 545 into IF signals and transmit the IF signals to the communication module via a conducting line.

Figure 8:
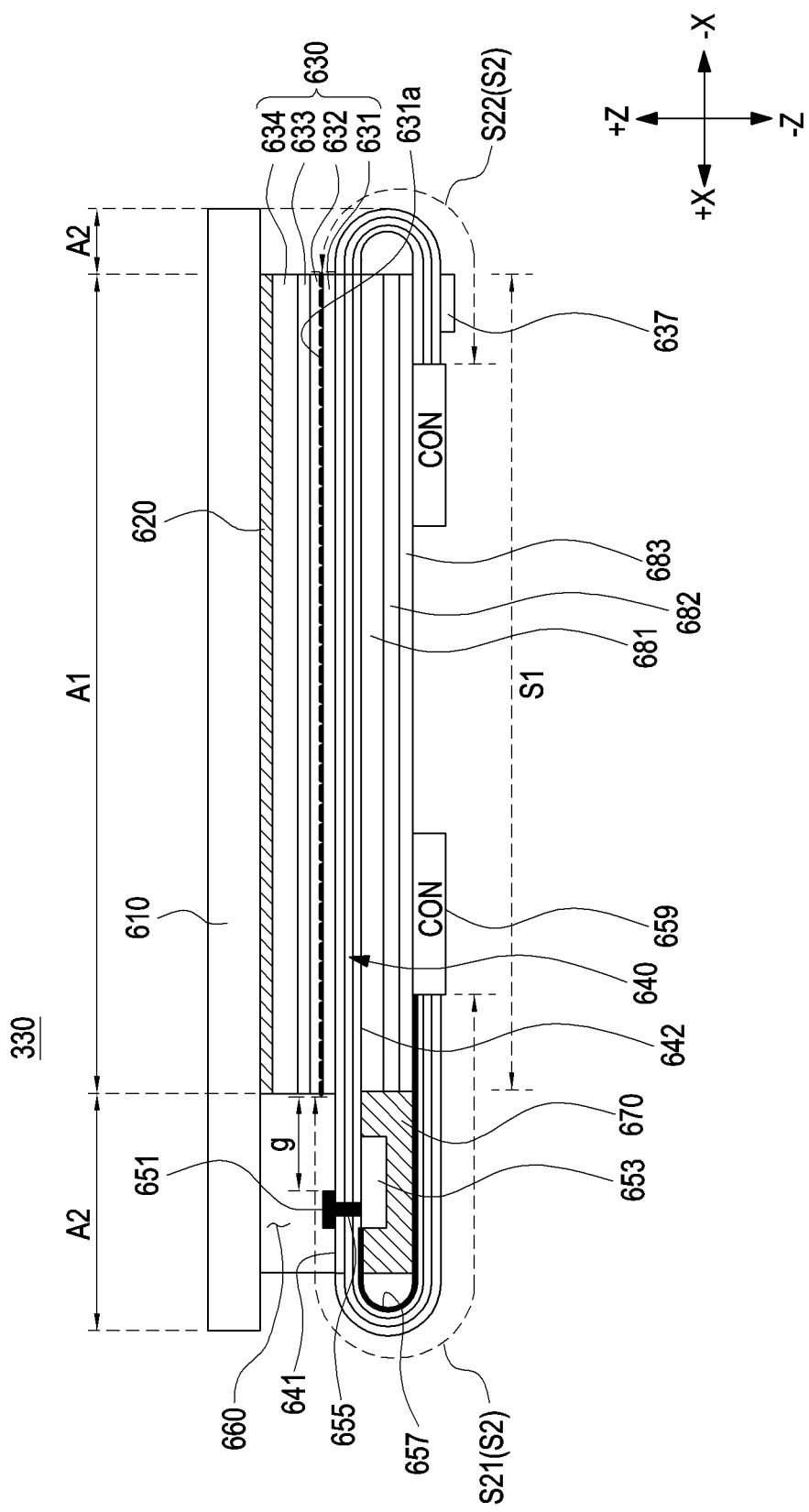
FIG. 8 is a diagram of a stack structure of layers constituting a display assembly disposed in an electronic device, according to an embodiment.

FIG. 8 is a diagram of a stack structure of layers constituting a display assembly disposed in an electronic device, according to an embodiment.

Referring to FIG. 8, a display assembly 330 may include a transparent member 610, a display panel 630 including at least one display pixel 631a, a board 640 electrically connected with the at least one display pixel(s), an antenna 651 formed in one area of the board 640, and an antenna communication circuit 653 electrically connected with the antenna 651. The display assembly 330 of FIG. 8 may have the same structure in whole or part as the display device 160 of FIG. 1 or the display 301 or 330 of FIG. 3 or 4. The antenna 651 of FIG. 8 may have the same structure in whole or part as the structure of the communication device 421 to 424 or 500 of FIG. 6 or 7.

In FIG. 8, 'X' and 'Z' in a two-axial rectangular coordinate system may denote the lengthwise direction and thickness direction, respectively, of the display assembly 330.'Z' may denote a first direction (+Z) or a second direction (-Z), and 'X' may denote a third direction (+X or -X).

The transparent member 610 may include a first surface 611 facing in the first direction +Z, a second surface 612 facing in the second direction -Z which is opposite to the first direction +Z, and a side surface facing in the third direction perpendicular to the first direction +Z or the second direction -Z. The transparent member 610 may include an active area A1 which substantially provides images and/or video to the user through the display panel 630 and inactive areas A2 extending from the active area A1 to edges of the transparent member 610. The display panel 630 may be disposed in flat state under the active area A1 of the transparent member 610, and at least part (e.g., the board 640) of the display assembly 330 may be disposed in a bent state under the inactive area A2. The bottom of the inactive area A2 may be coated with an opaque non-conductive material to prevent internal electronic parts, signal lines, or circuit lines from being exposed to the outside.

The display panel (e.g., an (active) organic light emitting diode (OLED)) 630 may be exposed through the transparent member 610 to the front surface 611 (e.g., front surface) and may include a display element layer 631 including at least one pixel 631a and a thin film transistor (TFT) layer 632 connected with the display element layer 631. An optical member and/or a touch sensor panel 633 may be equipped inside the display element layer 631 or between the transparent member 610 and the display element layer 631. The display panel 630 may be utilized as an input device equipped with touchscreen functionality, not alone as an output device for outputting screen. When the display panel 630 has touchscreen functionality, an indium-tin oxide (ITO) film for detecting the position of the user's contact may also correspond to the touch sensor panel 633. A dielectric layer may be disposed between the display element layer 631 and/or the touch sensor panel 633, and the board 640 may be disposed on the second surface (e.g., rear surface) of the display element layer 631.

The display element layer 631 may include a sealing member to cover and protect the light emitting elements (e.g., at least one pixel 631a) formed on the board 640. The sealing member may include glass, a high-molecular film, or metal. The sealing member may be formed of a thin film sealing layer with a plurality of organic films and inorganic films formed alternately at least one or more times. The sealing member may seal off at least one pixel 631a to protect the plurality of light emitting elements from foreign bodies (e.g., moisture and/or oxygen).

The display panel 630 disposed between the transparent member 610 and the board 640 may include an optical layer 634. The optical layer 634 may be intended for transmitting screen output from the display element layer 631 and at least one optical layer 634 may be stacked on the display element layer 631. The optical layer 634 may include an optical compensation film to calibrate the phase difference of the screen outputted from the display element layer 631. The optical layer 634 may include an optical compensation film (e.g., a polarizing film). The optical compensation film may include a polyvinyl alcohol (PVA) film and tri-acetyl cellulose (TAC) film each attached onto both surfaces, respectively, of the PVA film, where the outer surface-side TAC film may be protected by a surface coat layer.

A dielectric layer 620 may be provided between the transparent member 610 and the display panel 630. The dielectric layer 620 may be disposed in contact with the transparent member 610. The dielectric layer 620 may include silicon, air, a foam, a membrane, an optical clear adhesive (OCA), sponge, rubber, ink, or a polymer (e.g., polycarbonate (PC) or PET). The dielectric layer 620 may attach the transparent member 610 and/or the optical layer 634 or may be provided to have a different refractive index from the transparent member 610 and/or the optical layer 634.

The display assembly 330 may include the board 640. The board 640 may be formed of a transparent insulating board (e.g., glass or a high-molecular film) and, when the board is formed of a high-molecular film, may include a flexible board. The board 640 may be formed of a single polyimide (PI)-containing film or of a stack of a plurality of layers of PI-silicon nitride film (SiN)-PI in the order thereof.

The board 640 may include a first surface 641 and a second surface 642 facing away from the first surface 641. The board 640 may be electrically connected with the at least one display pixel 631a and may include a first area S1 which is formed of at least some layers of the display panel 630 and second areas S2 extending from the first area S1 to the outside of the display panel 630. In the first area S1 of the board 640, the first surface 641 may face in the first direction +Z, and the second surface 642 may face in the second direction -Z which is opposite to the first direction +Z. The second areas S2 of the board 640 may include a section extending and bent from the first area S2, and the first surface 641 or second surface 642 may face in the first direction +Z, the second direction -Z, or the third direction +X or -X depending on the section.

The first area S1 may form a flat face and support the display panel 630. The second areas S2 may include a first extension area S21 disposed to extend to one side of the first area S1 (e.g., an upper direction +X of the display panel 630) and a second extension area S22 disposed to extend to another side of the first area S1 (e.g., a lower direction -X of the display panel 630).

The first extension area S21 and the second extension area S22 of the board 640 may be formed of a flat surface or with a partially bent surface. A wireless communication device may be disposed on at least part of the first extension area S21. At least one antenna 651 may be disposed on the first surface 641 of the first extension area S21, and a communication circuit 653 electrically connected with the antenna 651 may be provided on the second surface 642 of the first extension area S21. The at least one antenna 651 and the communication circuit 653 may be disposed to face each other with the board 640 disposed therebetween and may be connected together through at least one conductive via 655 which passes through the board 640.

A dielectric 660 may be formed between the first extension area S21 of the board 640 and the transparent member 610. The dielectric 660 may fill the empty space under the upper area (e.g., the inactive area A2) of the transparent member 610 to which the display panel 630 does not reach and may be disposed to substantially surround the area where the antenna 651 is disposed. The dielectric 660 may be formed of one or a combination of a black embo layer (e.g., a PET layer), a porous material (e.g., a foam), a membrane, a polymer layer, and an air gap. The dielectric 660 may include an epoxy (e.g., FR 4) material and may be similar in permittivity to the transparent member 610. The permittivity of the dielectric 660 may be somewhere between about 4.0 and about 5.0. As another example, the permittivity of the dielectric 660 may be somewhere between about 4.4 and about 4.6.

A wire layer extending from the display panel 630 may be disposed on the second extension area S22 of the board 640. The wire layer formed on the board 640 may be disposed to pass over the first area S1 of the board 640 and to be bent on the second extension area S22. The display panel 630 may include the TFT layer 632 and the display element layer 631 with a plurality of signal lines and a plurality of pixels, and the wire layer electrically connected from the display element layer 631 and the TFT layer 632 may be formed on one surface or inside the board 640.

A display driver IC 637 and/or a touch sensor panel IC (TSP-IC) may be disposed on the second surface 642 of the second extension area S22 which faces in the second direction −Z. The wire layer may include a tape carrier package or chip-on-film with a driver chip or a flexible printed circuit film. The wire layer may be connected with an adjacent connector, and the connector may be connected with a printed circuit board where a control circuit is disposed. The display driver IC 637 may be electrically connected with the control circuit of the circuit board. The control circuit may receive and process image information including image data or image control signals corresponding to commands for controlling the image data in interoperation with the display driver IC 637 to allow visual information (e.g., text, images, or icons) to be displayed through the display panel 630.

The communication device may include the antenna 651 and the wireless communication circuit 653. The antenna 651 and the wireless communication circuit 653 may be disposed on one circuit board 640.

The antenna 651 may include at least one radiating conductor and may be formed on the first surface 641 of the first extension area S21. The antenna 651 may be spaced apart from the display panel 630 at a designated distance g or more. The antenna 651 may be spaced apart from an end of the display panel 630 at a distance corresponding to the antenna use frequency. The designated distance g may be as long as ¼ of the wavelength of the antenna and may be the distance between an end of the antenna 651 and an end of the display panel 630 which is adjacent the antenna 651. The radiating conductor(s) may be patch-type radiating conductor(s) or dipole-structure radiating conductor(s) extending in one direction. When there are provided a plurality of radiating conductors, the plurality of radiating conductors may be arrayed to form a designated pattern, thereby forming an antenna array. A chip (e.g., an IC chip) in which part of the wireless communication circuit 653 is implemented may be disposed on the opposite surface of the surface where the radiating conductors are disposed or on one side of the area where the radiating conductors are disposed. The radiating conductors may be formed on the second surface 642 of the first extension area S21. The interval between the plurality of radiating conductors may be ¼ or more of the wavelength (λ) corresponding to the antenna use frequency.

Although the plurality of radiating conductors are disposed to project on the first surface 641 of the board 640 at a predetermined thickness, embodiments of the disclosure are not limited thereto. The radiating conductors may be formed of thin plates on the first surface 641 or in an opening of the board without projecting beyond the outer surface of the board.

The plurality of radiating conductors may be electrically connected with a feeding part of the circuit board to transmit or receive high-frequency signals (e.g., RF signals) in at least one frequency band. The feeding part may be electrically connected to the plurality of radiating conductors to apply signal current, and thus supply RF signals, to the radiating conductors or receive other RF signals received through the radiating conductors.

The wireless communication circuit 653 may receive communication signals through an RF transceiver or transmit received communication signals to the RF transceiver. The wireless communication circuit 653 may be controlled by a processor to conduct wireless communication using the radiating conductors. According to an embodiment, the wireless communication circuit 653 may receive control signals and power from a power management module and the processor 440 to process communication signals received from the outside or communication signals to be sent to the outside. The wireless communication circuit 653 may include a switch circuit to split transmit and receive signals or various amplifiers or filters to raise the quality of transmit or receive signals.

When the plurality of radiating conductors form an antenna array, the wireless communication circuit 653 may include a phase shifter connected to each radiating conductor to thereby control the directivity of the communication device (e.g., the electronic device 200). When the communication device includes an antenna array, the wireless communication circuit 653 may provide phase difference power to each radiating conductor, controlling the directivity of the communication device or the electronic device 101 including the communication device. The phase difference power may be useful to secure an optimal or good communication environment in high-directivity communication schemes, such as mmWave communication (e.g., wireless communication adopting a frequency band of 6 GHz or more and 300 GHz or less).

The power line and/or signal line (e.g., an RF signal line) 657 to the wireless communication circuit 653 may be bent along the bent board 640, extending up to one surface of the display assembly 330 which faces in the second direction −Z and connecting with the connector 659. The connector 659 may be connected with a connector provided in the circuit board to establish a line path for transmitting power or communication signals. The power line and/or signal line (e.g., an RF signal line) 657 is disposed on one surface of the PI layer of the board 640 which faces in the second direction −Z according to an embodiment but, without limited thereto, may be disposed on one surface of the PI layer of the board 640 which faces in the first direction +Z or between the PI and SiN layers.

The wireless communication circuit 653 may be formed between the bent sections of the board 640. A shielding member 670 may be disposed at an inside of the bent section of the board 640 to shield the wireless communication circuit 653. The shielding member 670 may shield off electromagnetic interference (EMI) and provide a path for allowing heat generated from the wireless communication circuit 653 to conduct to a heat-radiating layer 683. For EMI shielding and/or efficient thermal conduction, the configuration of wrapping around the wireless communication circuit 653 may be design-changed with a board different from the board 640 instead of having the shielding member 670.

A polymer layer 681, a light blocking member 682, and/or a heat-radiating layer 683 may sequentially be arranged under the board 640. The light blocking member 682 may be provided as a layer to shield off the back surface of the display assembly 330 (e.g., a cushion member, embo member, or copper (CU) sheet) and come in black. The heat-radiating layer 683 may block heat generated from the board 640 or shield heat generated from the wireless communication circuit 653 from being transferred to the display panel 630. The heat-radiating layer 683 may contain a graphite material.

Figure 9:
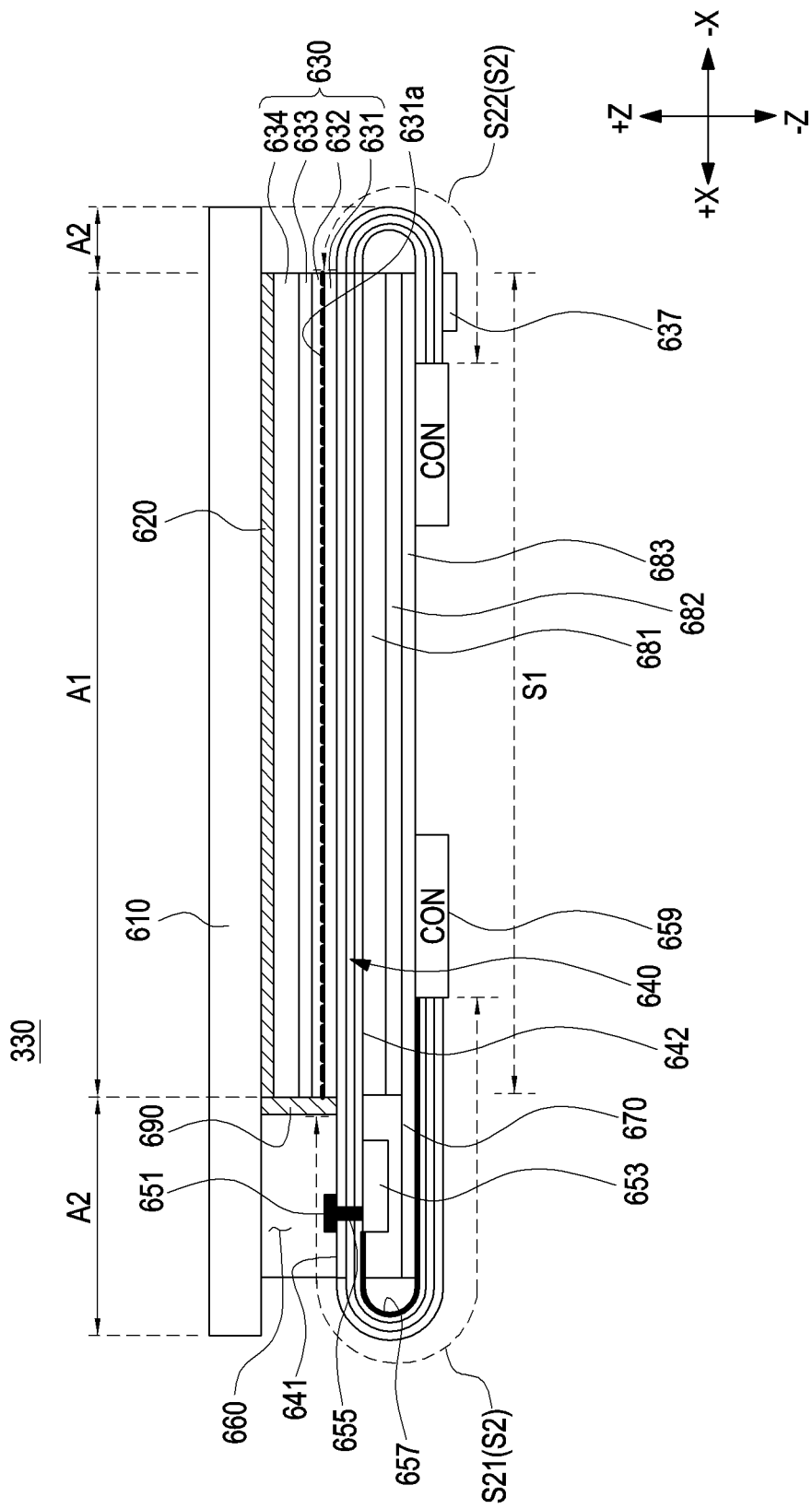
FIG. 9 is a diagram of a stack structure of layers constituting a display assembly disposed in an electronic device, according to an embodiment.

FIG. 9 is a diagram a stack structure of layers constituting a display assembly disposed in an electronic device, according to an embodiment.

Referring to FIG. 9, a display assembly 330 may include a transparent member 610, a display panel 630 including at least one display pixel 631a, a board 640 electrically connected with the at least one display pixel(s), an antenna 651 formed in one area of the board 640, and an antenna communication circuit 653 electrically connected with the antenna 651.

In FIG. 9, 'X' and 'Z' in a two-axial rectangular coordinate system may denote the lengthwise direction and thickness direction, respectively, of the display assembly 330. 'Z' may mean a first direction (+Z) or a second direction (−Z). X may mean a third direction (+X or −X).

The display assembly 330 of FIG. 9 may have the same structure in whole or part as the display device 160 of FIG. 1 or the display 301 or 330 of FIG. 3 or 4. The configuration of the transparent member 610, the display panel 630 with at least one display pixel 631a, the board 640, the antenna 651, and the antenna communication circuit 653 as shown in FIG. 8 may apply to the configuration of the display panel 630 with the transparent member 610, the display panel 630 with at least one display pixel 631a, the board 640, the antenna 651, and the antenna communication circuit 653 as shown in FIG. 9.

The display assembly 330 of FIG. 9 is described below in detail while focusing primarily on differences in configuration from the display assembly 330 of FIG. 8. In the active area A1 of the display assembly 330, the dielectric layer 620, the board 640, the display panel 630, the polymer layer 681, the light blocking member 682, and/or the heat-radiating layer 683 may be sequentially arranged from the transparent member 610. In the inactive area A2 (e.g., the upper area (+X direction) of the display panel 630) of the display assembly 330, the dielectric 660, the antenna 651, part of the board 640, the wireless communication circuit 653, the shielding member 670, the heat-radiating layer 683, and another part of the board 640 which is bent may be sequentially arranged from the transparent member 610.

The antenna 651 may include at least one radiating conductor and may be formed on the first surface 641 of the first extension area S21. The radiating conductor(s) may be patch-type radiating conductor(s) or dipole-structure radiating conductor(s) extending in one direction. When there are provided a plurality of radiating conductors, the plurality of radiating conductors may be arrayed to form a designated pattern, thereby forming an antenna array. The antenna 651 may be surrounded by the dielectric 660.

A conductive member 690 may be disposed between the transparent member 610 and the first extension area S21 of the board 640. The conductive member 690 may be formed between the antenna 651 and the display panel 630 to provide a shielding function of preventing signals of a designated frequency band radiated from the antenna 651 from being influenced by the display panel 630.

The wireless communication circuit 653 may be disposed on a side of the area where the antenna 651 is disposed or on a surface facing away from the surface where the antenna is disposed. The radiating conductors may be formed on the second surface 642 of the first extension area S21. The wireless communication circuit 653 may be surrounded by the shielding member 670, and the heat-radiating layer 683 may be disposed in the second direction −Z. The heat-radiating layer 683 may extend from the area (e.g., the active area A1) where the display panel 630 is disposed to the extension area (e.g., the inactive area A2) of the board 640, facing the wireless communication circuit 653. Accordingly, heat generated from the wireless communication circuit 653 may be quickly conducted to the heat-radiating layer 683 and, thus, efficient heat radiation may be achieved.

Figure 10:
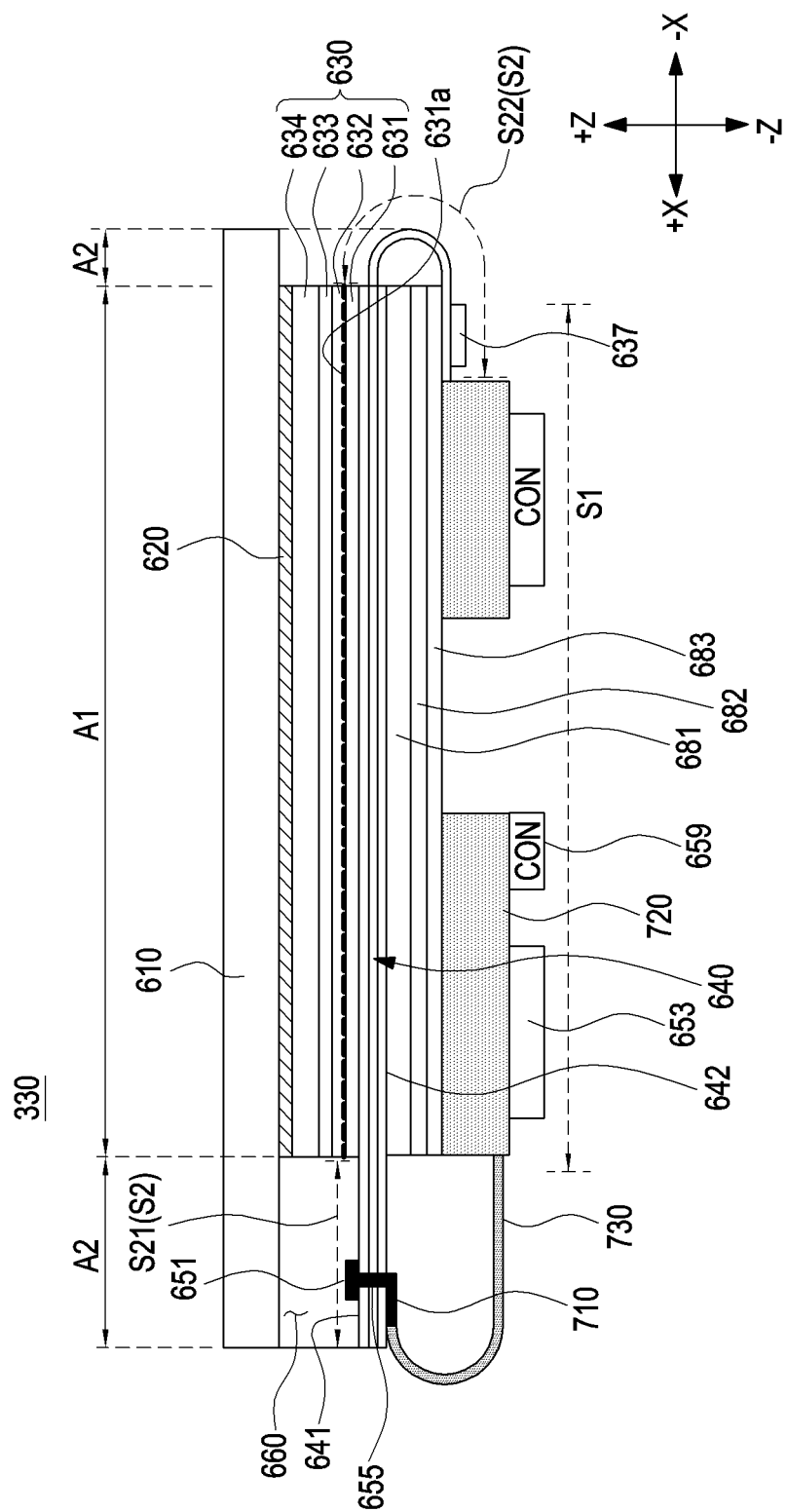
FIG. 10 is a diagram of a stack structure of layers constituting a display assembly disposed in an electronic device, according to an embodiment.

FIG. 10 is a diagram of a stack structure of layers constituting a display assembly disposed in an electronic device, according to an embodiment.

Referring to FIG. 10, a display assembly 330 may include a transparent member 610, a display panel 630 including at least one display pixel 631a, a board 640 electrically connected with the at least one display pixel(s), an antenna 651 formed in one area of the board 640, and an antenna communication circuit 653 electrically connected with the antenna 651.

In FIG. 10, 'X' and 'Z' in a two-axial rectangular coordinate system may denote the lengthwise direction and thickness direction, respectively, of the display assembly 330. 'Z' may mean a first direction (+Z) or a second direction (−Z). X may mean a third direction (+X or −X).

The display assembly 330 of FIG. 10 may have the same structure in whole or part as the display device 160 of FIG. 1 or the display 301 or 330 of FIG. 3 or 4. Part of the configuration of the transparent member 610, the display panel 630 with at least one display pixel 631a, the board 640, the antenna 651, and the antenna communication circuit 653 as shown in FIG. 8 may apply to the configuration of the display panel 630 with the transparent member 610, the display panel 630 with at least one display pixel 631a, the board 640, the antenna 651, and the antenna communication circuit 653 as shown in FIG. 10.

The display assembly 330 of FIG. 10 is described below in detail while focusing primarily on differences in configuration from the display assembly 330 of FIG. 8.

In the active area A1 of the display assembly 330, the dielectric layer 620, the board 640, the display panel 630, the polymer layer 681, the light blocking member 682, and/or the heat-radiating layer 683 may be sequentially arranged from the transparent member 610. A first printed circuit board 720 which differs from the board 640 may be disposed under the heat-radiating layer 683.

In the inactive area A2 (e.g., the upper area (+X direction) of the display panel 630) of the display assembly 330, the dielectric 660, the antenna 651, the board 640, and a second printed circuit board 730 extending from the first printed circuit board 720 may be sequentially arranged from the transparent member 610.

The antenna 651 may include at least one radiating conductor and may be formed on the first surface 641 of the first extension area S21. The radiating conductor(s) may be patch-type radiating conductor(s) or dipole-structure radiating conductor(s) extending in one direction. When there are provided a plurality of radiating conductors, the plurality of radiating conductors may be arrayed to form a designated pattern, thereby forming an antenna array. The antenna 651 may be electrically connected with an attaching member 710 formed on the second surface 642 of the board 640 via a conductive via 655 which passes through the board 640. The attaching member 710 may include a conductive film as an attaching material. The conductive film may include an anisotropic conductive film. The attaching member 710 may be used to provide an electric connection with the second printed circuit board 730 formed as a separate structure. The attaching member 710, after coupled with the second surface 642 of the board 640, may provide heat and thus conductance of the conductive via 655 and the ground.

The first printed circuit board 720 and the second printed circuit board 730 may be flexible circuit boards. The second printed circuit board 730 may be bent and extend to the first printed circuit board 720. A wire layer to connect the antenna 651 and the wireless communication circuit 653 may be formed on the second printed circuit board 730. One surface of the first printed circuit board 720 which faces in the first direction +Z may be stacked on the heat-radiating layer 683, and the wireless communication circuit 653 and the connector 659 may be disposed on one surface of the first printed circuit board 720 which faces in the second direction −Z. A chip (e.g., an IC chip) in which part of the wireless communication circuit 653 is implemented may be disposed to face away from the surface where the antenna (e.g., radiating conductor(s)) is disposed.

The wireless communication circuit 653 may receive communication signals through an RF transceiver or transmit received communication signals to the RF transceiver. The wireless communication circuit 653 may be controlled by a processor to conduct wireless communication using the radiating conductors. The wireless communication circuit 653 may receive control signals and power from a power management module and the processor 440 to process communication signals received from the outside or communication signals to be sent to the outside. The wireless communication circuit 653 may include a switch circuit to split transmit and receive signals or various amplifiers or filters to raise the quality of transmit or receive signals.

The power line and/or signal line (e.g., RF signal line) to the wireless communication circuit 653 may be bent corresponding to the bent shape of the second printed circuit board 730 and be formed on the top of the second printed circuit board 730 or inside the second printed circuit board 730 and connect to the connector 659 via the first printed circuit board 720. The connector 659 may be connected with a connector provided in the circuit board to establish a line path for transmitting power or communication signals.

The antenna 651 may be disposed on one surface of the extending board 640. However, the wireless communication circuit 653 is disposed not on the surface of the extending board 640 but on an additional board (e.g., the first printed circuit board 720), thereby minimizing bending or extension of the board 640 while securing a space for mounting the antenna 651 and maintaining the performance of antenna.

Figure 11:
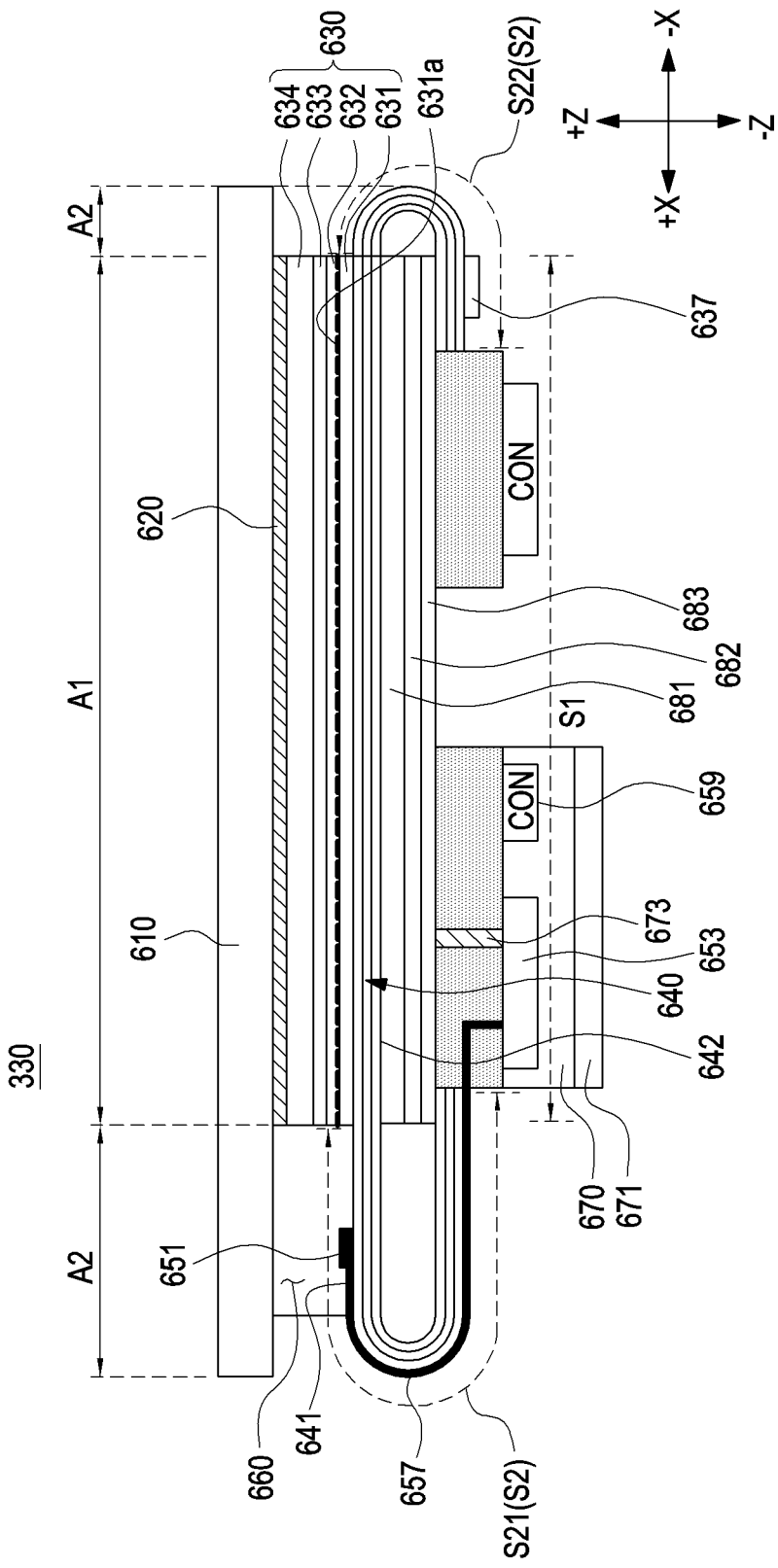
FIG. 11 is a diagram of a stack structure of layers constituting a display assembly disposed in an electronic device, according to an embodiment.

FIG. 11 is a diagram of a stack structure of layers constituting a display assembly disposed in an electronic device, according to an embodiment.

Referring to FIG. 11, a display assembly 330 may include a transparent member 610, a display panel 630 including at least one display pixel 631a, a board 640 electrically connected with the at least one display pixel(s), an antenna 651 formed in one area of the board 640, and an antenna communication circuit 653 electrically connected with the antenna 651.

In FIG. 11, 'X' and 'Z' in a two-axial rectangular coordinate system may denote the lengthwise direction and thickness direction, respectively, of the display assembly 330. 'Z' may mean a first direction (+Z) or a second direction (−Z). X may mean a third direction (+X or −X).

The display assembly 330 of FIG. 11 may have the same structure in whole or part as the display device 160 of FIG. 1 or the display 301 or 330 of FIG. 3 or 4. Part of the configuration of the transparent member 610, the display panel 630 with at least one display pixel 631a, the board 640, the antenna 651, and the antenna communication circuit 653 as shown in FIG. 8 may apply to the configuration of the display panel 630 with the transparent member 610, the display panel 630 with at least one display pixel 631a, the board 640, the antenna 651, and the antenna communication circuit 653 as shown in FIG. 10.

The display assembly 330 of FIG. 11 is described below in detail while focusing primarily on differences in configuration from the display assembly 330 of FIG. 8.

In the active area A1 of the display assembly 330, the dielectric layer 620, the board 640, the display panel 630, the polymer layer 681, the light blocking member 682, and/or the heat-radiating layer 683 may be sequentially arranged from the transparent member 610. The first printed circuit board 720 connected with at least one board 640 may be disposed under the heat-radiating layer 683.

In the inactive area A2 (e.g., the upper area (+X direction) of the display panel 630) of the display assembly 330, the dielectric 660, the antenna 651, and the second areas S2 of the board 640 may be sequentially arranged from the transparent member 610.

The antenna 651 may include at least one radiating conductor and may be formed on the first surface 641 of the first extension area S21. The radiating conductor(s) may be, e.g., patch-type radiating conductor(s) or dipole-structure radiating conductor(s) extending in one direction. When there are provided a plurality of radiating conductors, the plurality of radiating conductors may be arrayed to form a designated pattern, thereby forming an antenna array. The antenna 651 may be surrounded by the dielectric 660. A ground 656 may be disposed on part of the second surface 642 which faces the first surface 641 of the board 640 where the antenna 651 is disposed.

The second areas S2 of the board 640 may be bent so that some areas face each other. An end of the board 640 may be electrically connected with the first printed circuit board 720. An antenna signal line 657 may be formed along the first surface 641 of the board 640 where the antenna 651 is disposed and be electrically connected with the wireless communication circuit 653 through the first printed circuit board 720. An antenna signal line 657 may be formed on the second surface 642 which faces the first surface 641 where the antenna 651 is disposed and be electrically connected with the wireless communication circuit 653 through the first printed circuit board 720. In this case, the antenna 651 and the antenna signal line may conduct electricity along a conductive via which passes through the board 640.

The first printed circuit board 720 may be a flexible circuit board. A wire layer to connect the antenna 651 and the wireless communication circuit 653 may be formed on the first printed circuit board 720. One surface of the first printed circuit board 720 which faces in the first direction +Z may be stacked on the heat-radiating layer 683, and the wireless communication circuit 653 and the connector 659 may be disposed on one surface of the first printed circuit board 720 which faces in the second direction −Z. A chip (e.g., an IC chip) in which part of the wireless communication circuit 653 is implemented may be disposed to face away from the surface where the antenna (e.g., radiating conductor(s)) is disposed. A thermal via 673 which passes through the first printed circuit board 720 may be formed to create a thermal path along which heat generated from the wireless communication circuit 653 is conducted to the heat-radiating layer 683.

The wireless communication circuit 653 may receive communication signals through an RF transceiver or transmit received communication signals to the RF transceiver.

The wireless communication circuit 653 may be controlled by a processor to conduct wireless communication using the antenna (e.g., radiating conductor(s)) 651. The wireless communication circuit 653 may receive control signals and power from a power management module and the processor 440 to process communication signals received from the outside or communication signals to be sent to the outside. The wireless communication circuit 653 may include a switch circuit to split transmit and receive signals or various amplifiers or filters to raise the quality of transmit or receive signals.

The power line and/or signal line (e.g., RF signal line) 657 to the wireless communication circuit 653 may extend along the first printed circuit board 720 and connect to the connector 659. The connector 659 may be connected with a connector provided in the circuit board to establish a line path for transmitting power or communication signals.

A shielding member 670 may be disposed on the first printed circuit board 720 to surround at least part of the wireless communication circuit 653, thereby providing an EMI shielding effect. A thermal interface material (TIM) or heat pipe may be disposed facing the shielding member 670, thereby creating a path for thermal conductance to the surroundings of the wireless communication circuit 653.

Figure 12:
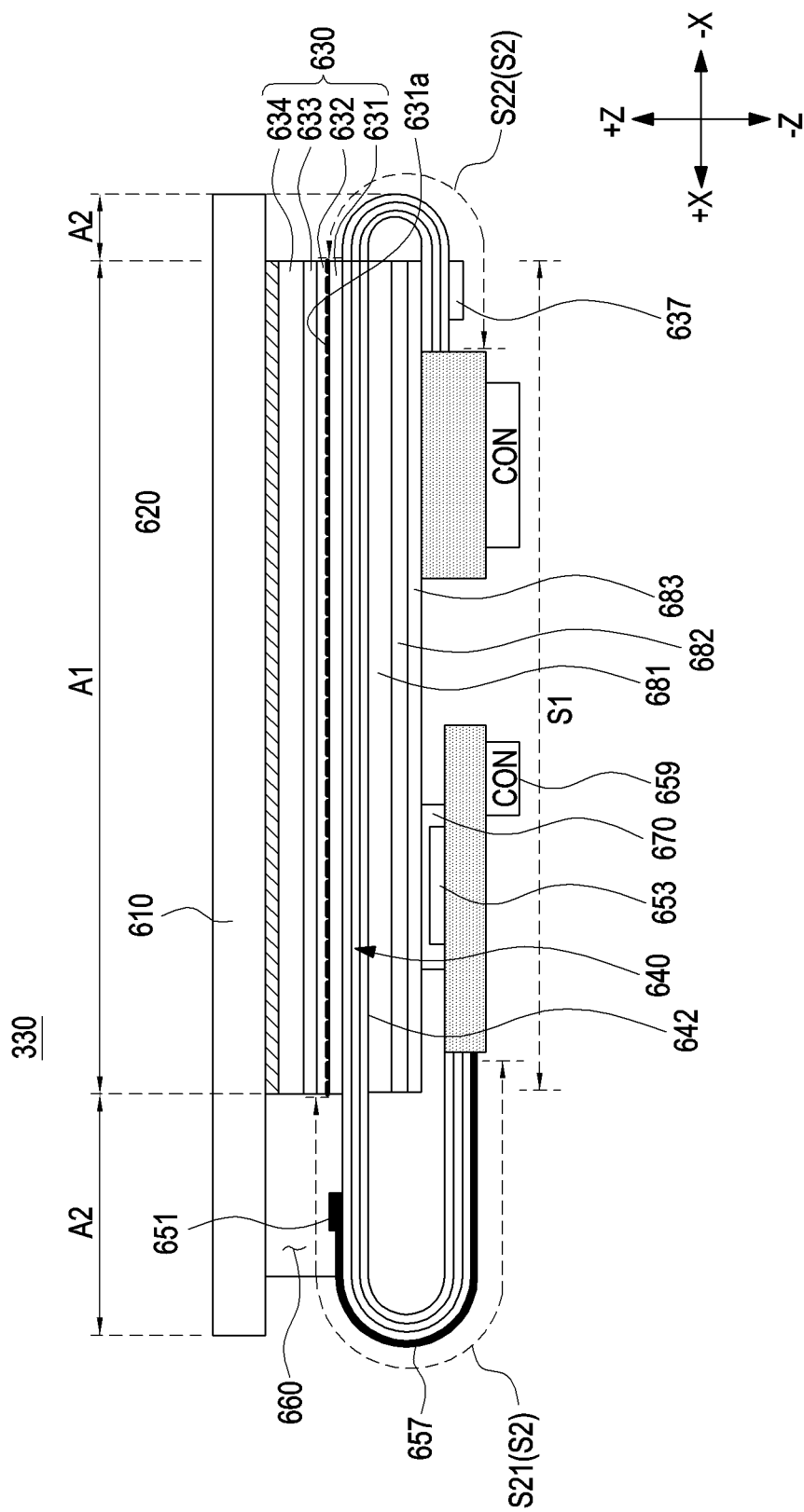
FIG. 12 is a diagram of a stack structure of layers constituting a display assembly disposed in an electronic device, according to an embodiment.

FIG. 12 is a diagram of a stack structure of layers constituting a display assembly disposed in an electronic device, according to an embodiment.

Referring to FIG. 12, a display assembly 330 may include a transparent member 610, a display panel 630 including at least one display pixel 631*a*, a board 640 electrically connected with the at least one display pixel(s), an antenna 651 formed in one area of the board 640, and an antenna communication circuit 653 electrically connected with the antenna 651.

In FIG. 12, 'X' and 'Z' in a two-axial rectangular coordinate system may denote the lengthwise direction and thickness direction, respectively, of the display assembly 330. 'Z' may mean a first direction (+Z) or a second direction (−Z). X may mean a third direction (+X or −X).

The display assembly 330 of FIG. 12 may have the same structure in whole or part as the display device 160 of FIG. 1 or the display 301 or 330 of FIG. 3 or 4. Part of the configuration of the transparent member 610, the display panel 630 with at least one display pixel 631*a*, the board 640, the antenna 651, and the antenna communication circuit 653 as shown in FIG. 11 may apply to the configuration of the display panel 630 with the transparent member 610, the display panel 630 with at least one display pixel 631*a*, the board 640, the antenna 651, and the antenna communication circuit 653 as shown in FIG. 12.

The display assembly 330 of FIG. 12 is described below in detail while focusing primarily on differences in configuration from the display assembly 330 of FIG. 11.

In the active area A1 of the display assembly 330, the dielectric layer 620, the board 640, the display panel 630, the polymer layer 681, the light blocking member 682, and/or the heat-radiating layer 683 may be sequentially arranged from the transparent member 610. The first printed circuit board 720 connected with at least one board 640 may be disposed under the heat-radiating layer 683.

In the inactive area A2 (e.g., the upper area (+X direction) of the display panel 630) of the display assembly 330, the dielectric 660, the antenna 651, and the second areas S2 of the board 640 may be sequentially arranged from the transparent member 610.

The antenna 651 may include at least one radiating conductor and may be formed on the first surface 641 of the first extension area S21. The radiating conductor(s) may be patch-type radiating conductor(s) or dipole-structure radiating conductor(s) extending in one direction.

The second areas S2 of the board 640 may be stacked and bent to face each other. An end of the board 640 may be electrically connected with the first printed circuit board 720.

The first printed circuit board 720 may be a flexible circuit board. A wire layer to connect the antenna 651 and the wireless communication circuit 653 may be formed on the first printed circuit board 720. The wireless communication circuit 653 may be disposed on one surface of the first printed circuit board 720 which faces in the first direction +Z to be stacked on the heat-radiating layer 683, and the connector 659 may be disposed on one surface facing in the second direction −Z. The first printed circuit board 720 may have a shielding member 670 to surround at least part of the wireless communication circuit 653 so that heat generated from the wireless communication circuit 653 is conducted along a thermal path to the heat-radiating layer 683. A TIM or heat pipe may be disposed facing the shielding member 670, thereby creating a path for thermal conductance to the surroundings of the wireless communication circuit 653.

Figure 13:
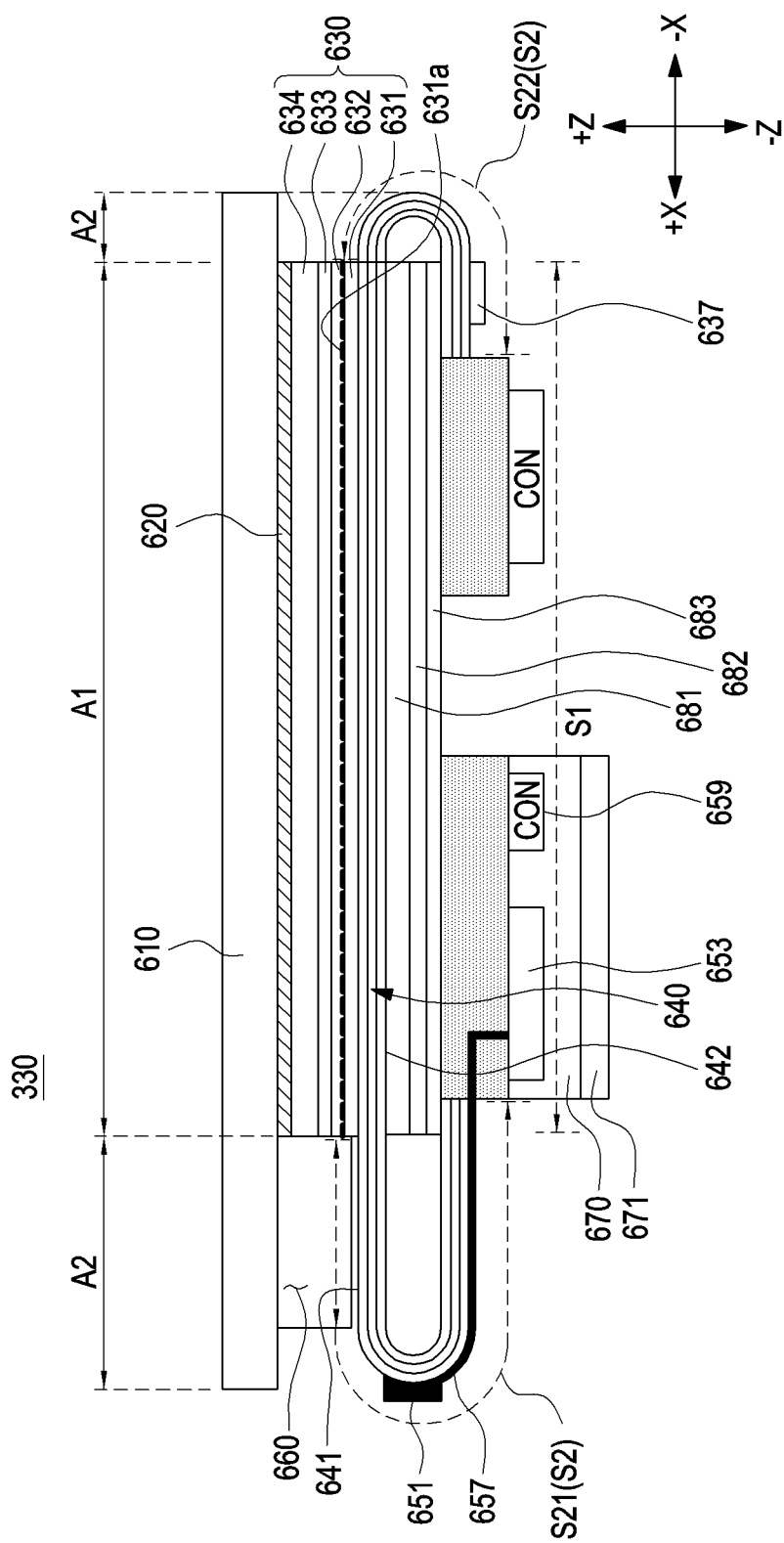
FIG. 13 is a diagram of a stack structure of layers constituting a display assembly disposed in an electronic device, according to an embodiment.

FIG. 13 is a diagram of a stack structure of layers constituting a display assembly disposed in an electronic device, according to an embodiment.

Referring to FIG. 13, a display assembly 330 may include a transparent member 610, a display panel 630 including at least one display pixel 631*a*, a board 640 electrically connected with the at least one display pixel(s), an antenna 651 formed in one area of the board 640, and an antenna communication circuit 653 electrically connected with the antenna 651.

In FIG. 13, 'X' and 'Z' in a two-axial rectangular coordinate system may denote the lengthwise direction and thickness direction, respectively, of the display assembly 330. 'Z' may mean a first direction (+Z) or a second direction (−Z). X may mean a third direction (+X or −X).

The display assembly 330 of FIG. 13 may have the same structure in whole or part as the display device 160 of FIG. 1 or the display 301 or 330 of FIG. 3 or 4. Part of the configuration of the transparent member 610, the display panel 630 with at least one display pixel 631*a*, the board 640, the antenna 651, and the antenna communication circuit 653 as shown in FIG. 11 may apply to the configuration of the display panel 630 with the transparent member 610, the display panel 630 with at least one display pixel 631*a*, the board 640, the antenna 651, and the antenna communication circuit 653 as shown in FIG. 13.

The display assembly 330 of FIG. 13 is described below in detail while focusing primarily on differences in configuration from the display assembly 330 of FIG. 11.

In the active area A1 of the display assembly 330, the dielectric layer 620, the board 640, the display panel 630, the polymer layer 681, the light blocking member 682, and/or the heat-radiating layer 683 may be sequentially arranged from the transparent member 610. The first printed circuit board 720 connected with at least one board 640 may be disposed under the heat-radiating layer 683.

In the inactive area A2 (e.g., the upper area (+X direction) of the display panel 630) of the display assembly 330, the dielectric 660, the antenna 651, and the second areas S2 of the board 640 may be sequentially arranged from the transparent member 610.

The antenna 651 may include at least one radiating conductor and may be formed on the first surface 641 of the first extension area S21. The radiating conductor(s) may be patch-type radiating conductor(s) or dipole-structure radiating conductor(s) extending in one direction.

The antenna 651 may be disposed on the bent area of the board 640 to face a side surface of the electronic device. At least part of the bent area of the board 640 may provide a face which faces in the third direction +X or −X, and the wireless communication circuit 653 may be disposed on the surface.

Figure 14A:
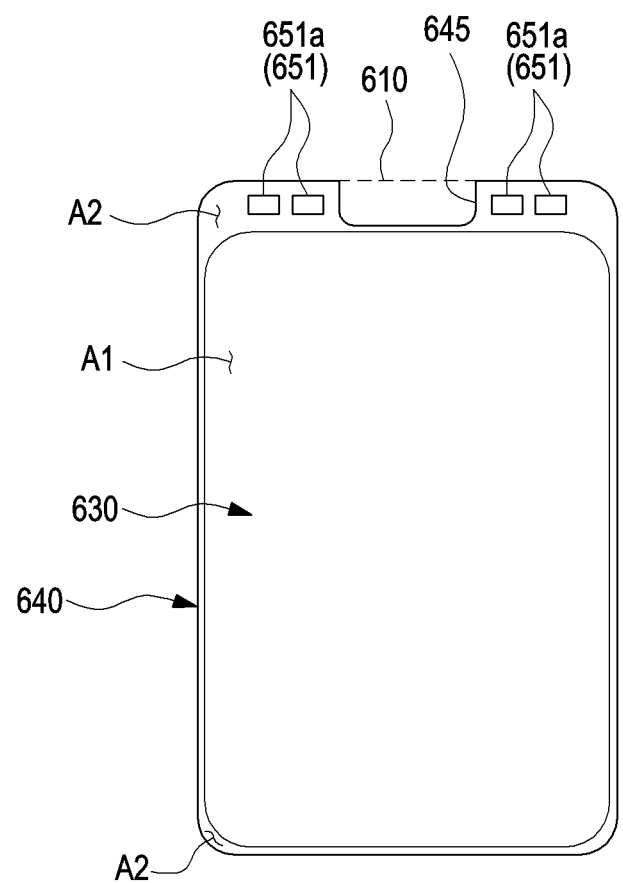
FIG. 14A is a diagram of a front surface of a display assembly with an array of patch antennas, according to an embodiment.
Figure 14B:
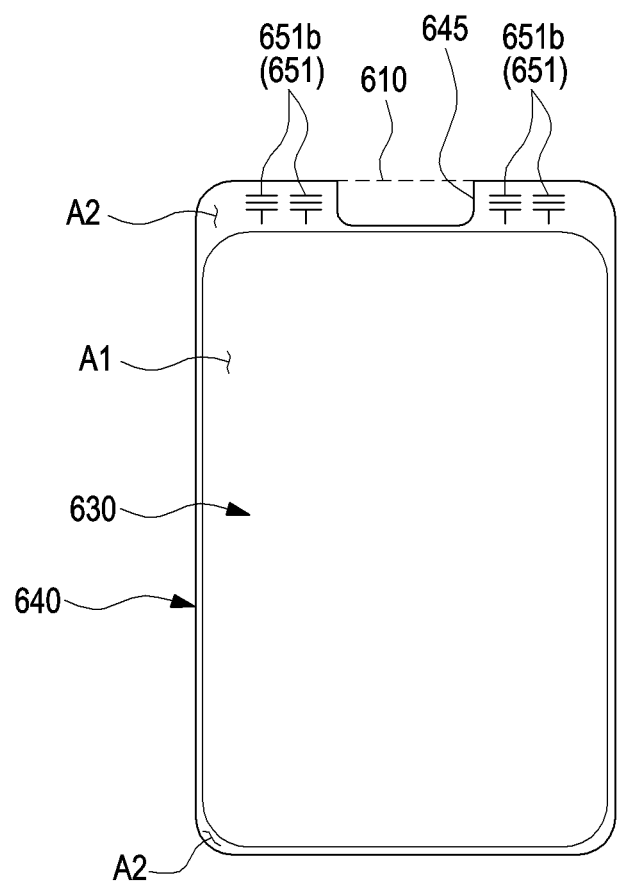
FIG. 14B is a diagram of a front surface of a display assembly with an array of dipole antennas, according to an embodiment.
Figure 14C:
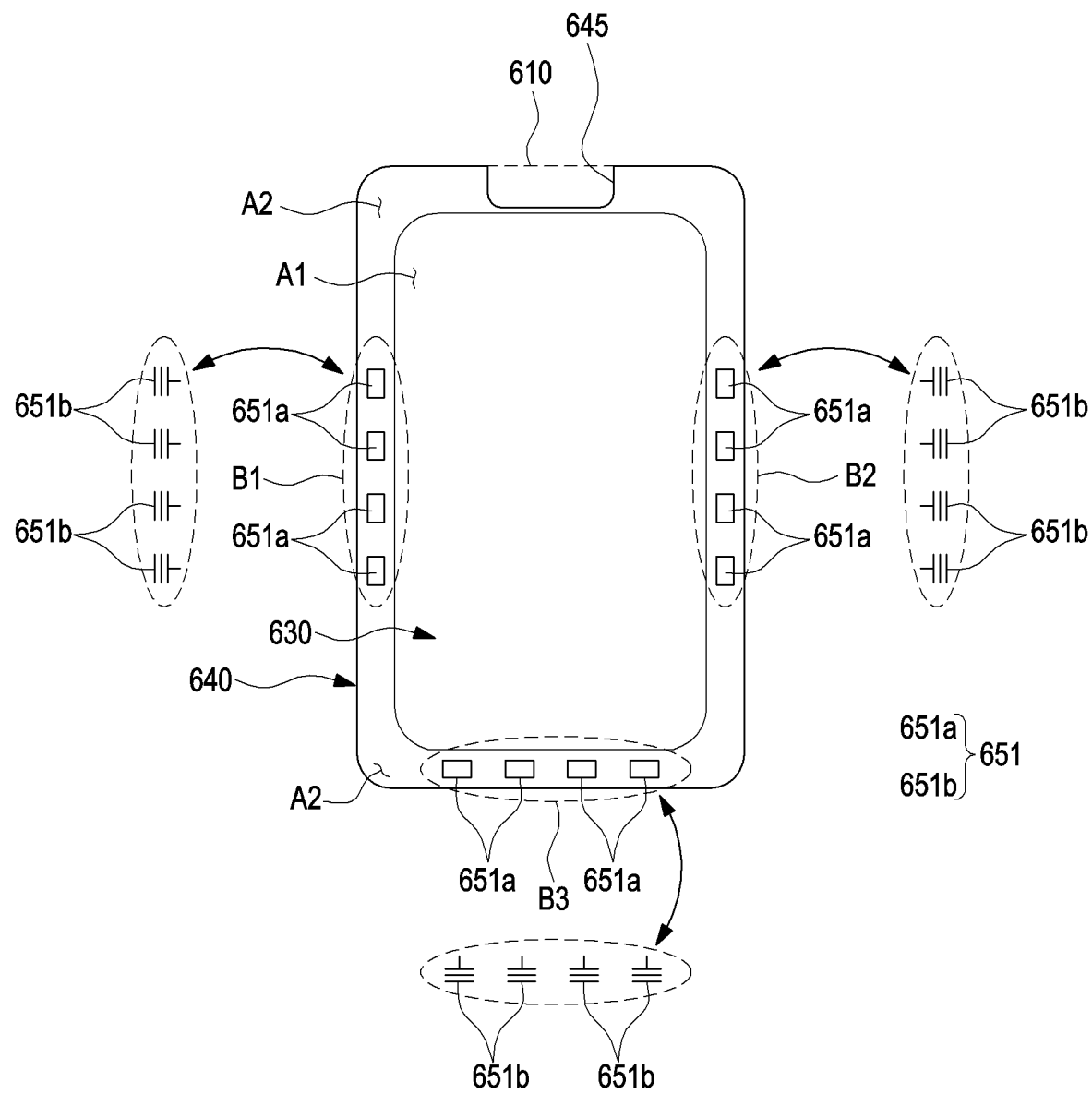
FIG. 14C is a diagram of a front surface of a display assembly with an array of antennas according to an embodiment.
Figure 14D:
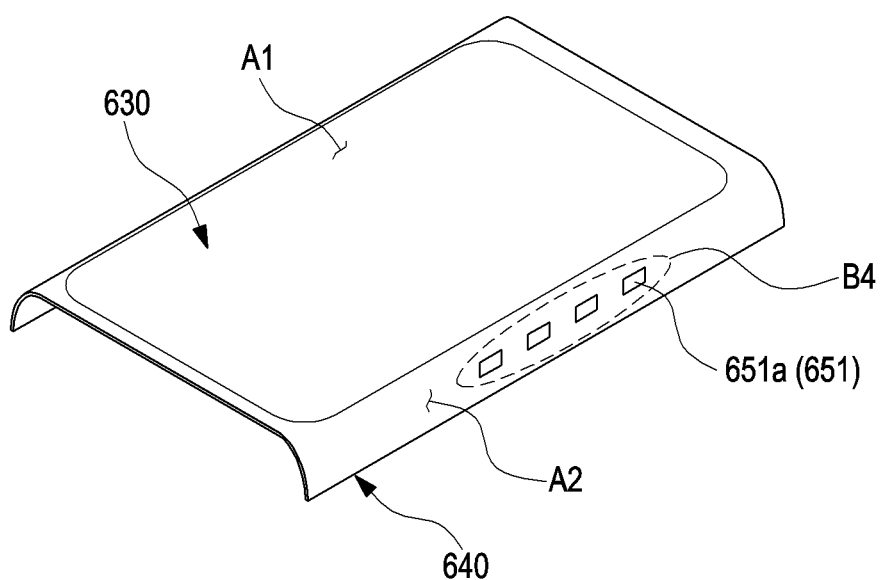
FIG. 14D is a diagram of a display assembly with an array of antennas on a curved side surface of the display, according to an embodiment.

FIG. 14A is a diagram of a front surface of a display assembly with an array of patch antennas, according to an embodiment. FIG. 14B is a diagram of a front surface of a display assembly with an array of dipole antennas, according to an embodiment. FIG. 14C is a diagram of a front surface of a display assembly with an array of antennas, according to an embodiment. FIG. 14D is a diagram of a display assembly with an array of antennas on a curved side surface of the display, according to an embodiment.

Referring to FIGS. 14A to 14D, a display assembly 330 may include a transparent member 610, a display panel 630 including at least one display pixel 631a, a board 640 electrically connected with the at least one display pixel, and an antenna 651 formed in one area of the board 640. The display assembly 330 of FIGS. 14A to 14D may have the same structure in whole or part as the display assembly 330 of FIG. 8.

The transparent member 610 may cover the front surface of the display assembly 330. The transparent member 610 may include an active area A1 which substantially provides images and/or video to the user through the display panel 630 and inactive areas A2 extending from the active area A1 to an edge of the transparent member 610. The bottom of the inactive area A2 may be coated with an opaque non-conductive material to prevent internal electronic parts, signal lines, or circuit lines from being exposed to the outside. Parts (e.g., the antenna 651) inside the inactive areas A2, although indeed invisible from the outside, are shown to be visible for illustration purposes.

The display panel 630 may be disposed in flat state under the active area A1 of the transparent member 610, and at least part (e.g., the board 640) of the display assembly 330 may be disposed in a bent state under the inactive area A2.

Referring to FIG. 14A, antennas 651 may be disposed in an upper area of the board 640. The antennas 651 may include a plurality of radiating conductors which may be patch-type radiating conductors. The plurality of radiating patches 651a may be arrayed to form a designated pattern, thereby forming an antenna array. A notch 645 may be formed in the middle of the board 640 to provide a space for mounting electronic parts (e.g., a space for placing a camera module or a sensor module, and the array of the plurality of radiating patches 651a may be formed on each side of the middle.

Referring to FIG. 14B, antennas 651 may be disposed in an upper area of the board 640. The antennas 651 may include a plurality of radiating conductors which may be dipole-structure radiating conductors extending in one direction. The plurality of dipole structures 651b may be arrayed to form a designated pattern, thereby forming an antenna array. A notch 645 may be formed in the middle of the board 640 to provide a space for mounting electronic parts, and the array of the plurality of dipole structures 651b may be formed on each side of the middle.

Referring to FIG. 14C, antennas 651 may be disposed in edge areas (e.g., inactive areas A2) of the board 640. The antennas 651 may include a plurality of radiating conductors which may be patch-type radiating conductors or dipole-structure radiating conductors extending in one direction. The plurality of radiating patches 651a or dipole structures 651b may be arrayed to form a designated pattern, thereby forming an antenna array. The arrayed antennas 651 may be arranged in a left area B1 of the board 640 and, in the case of a plurality of radiating patches 651a, their respective surfaces may be arrayed to face ahead while in the case of dipole structures 651b, their respective surfaces may be arrayed to the left. The arrayed antennas 651 may be arranged in a right area B2 of the board 640 and, in the case of a plurality of radiating patches 651a, their respective surfaces may be arrayed to face ahead while in the case of dipole structures 651b, their respective surfaces may be arrayed to the right. The arrayed antennas 651 may be arranged in a lower area B3 of the board 640 and, in the case of a plurality of radiating patches 651a, their respective surfaces may be arrayed to face ahead while in the case of dipole structures 651b, their respective surfaces may be arrayed to the bottom.

Referring to FIG. 14D, antennas 651 may be disposed in edge areas (e.g., inactive areas A2) of the board 640. The antennas 651 may include a plurality of radiating conductors which may be patch-type radiating conductors or dipole-structure radiating conductors extending in one direction. Edge areas of the board 640 may be bent and, when the bent areas face to the sides, the antennas 651 may be disposed to the sides. The arrayed antennas 651 may be arranged in the bent areas B4 of the board 640 and, in the case of a plurality of radiating patches 651a, their respective surfaces may be arrayed to the sides.

Figure 15:
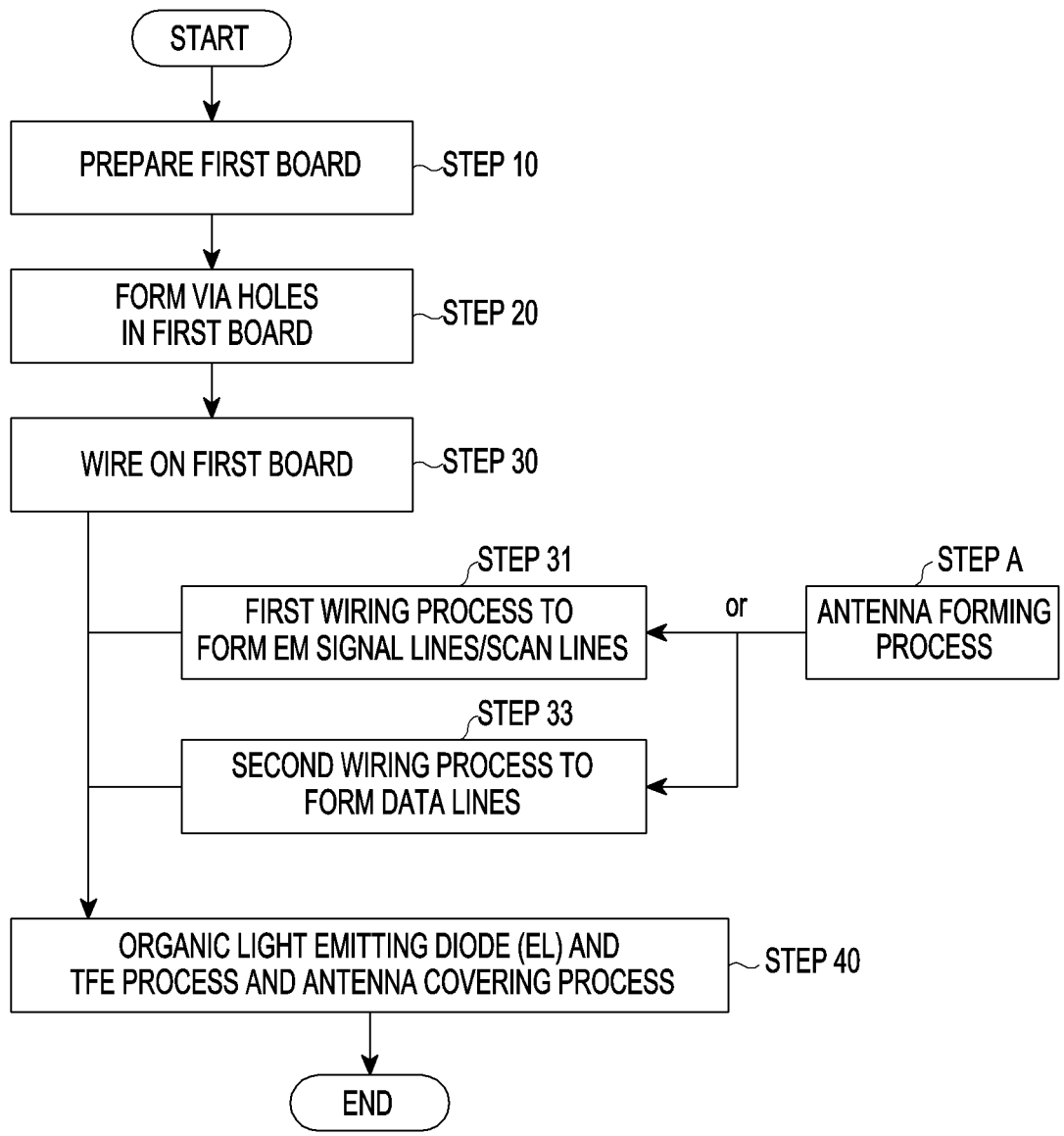
FIG. 15 is a flowchart of a process of forming a conductive via and an antenna pattern in a board, according to an embodiment.
Figure 16A:
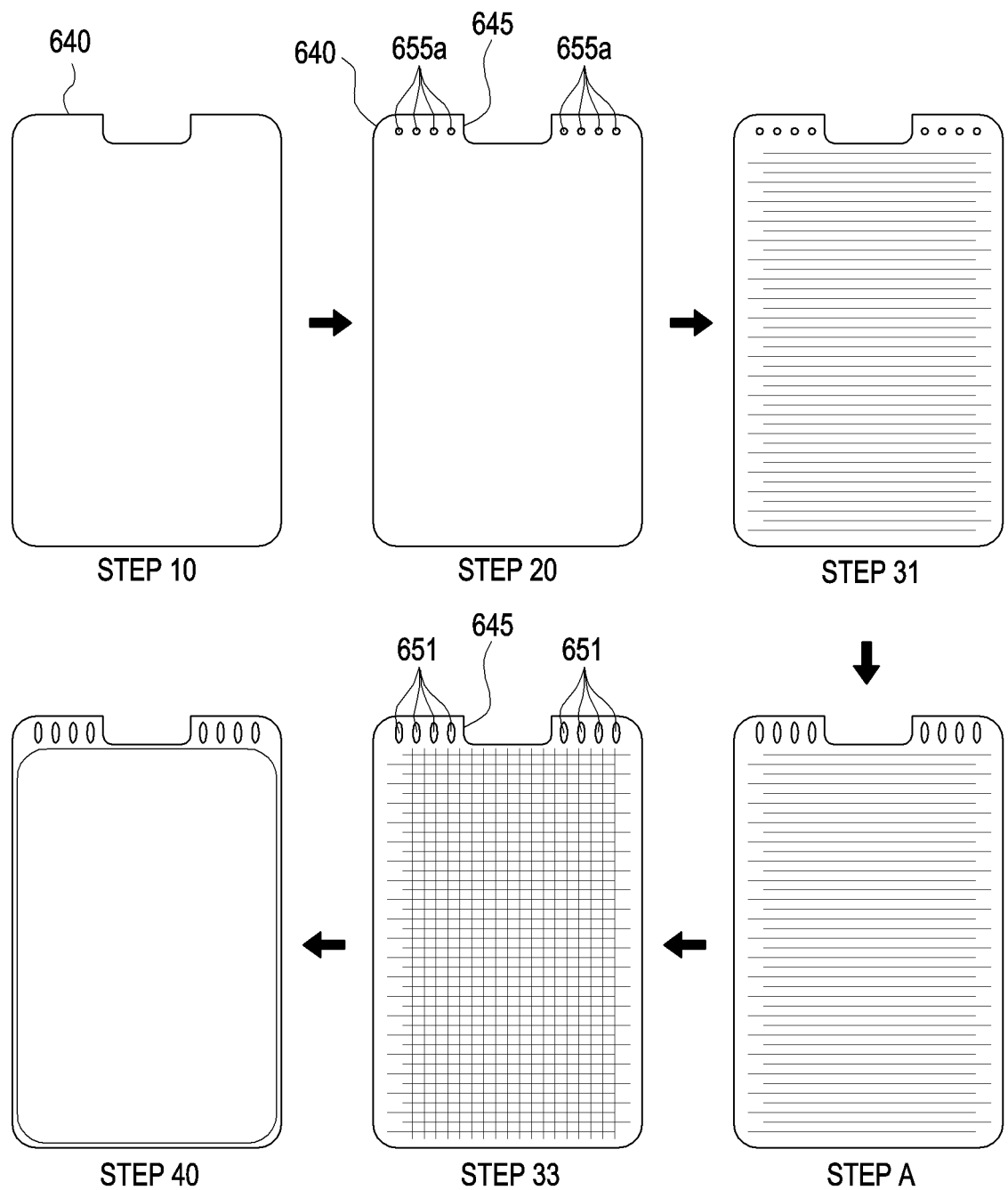
FIGS. 16A and 16B are diagrams schematically illustrating the process of FIG. 15, according to an embodiment.
Figure 16B:
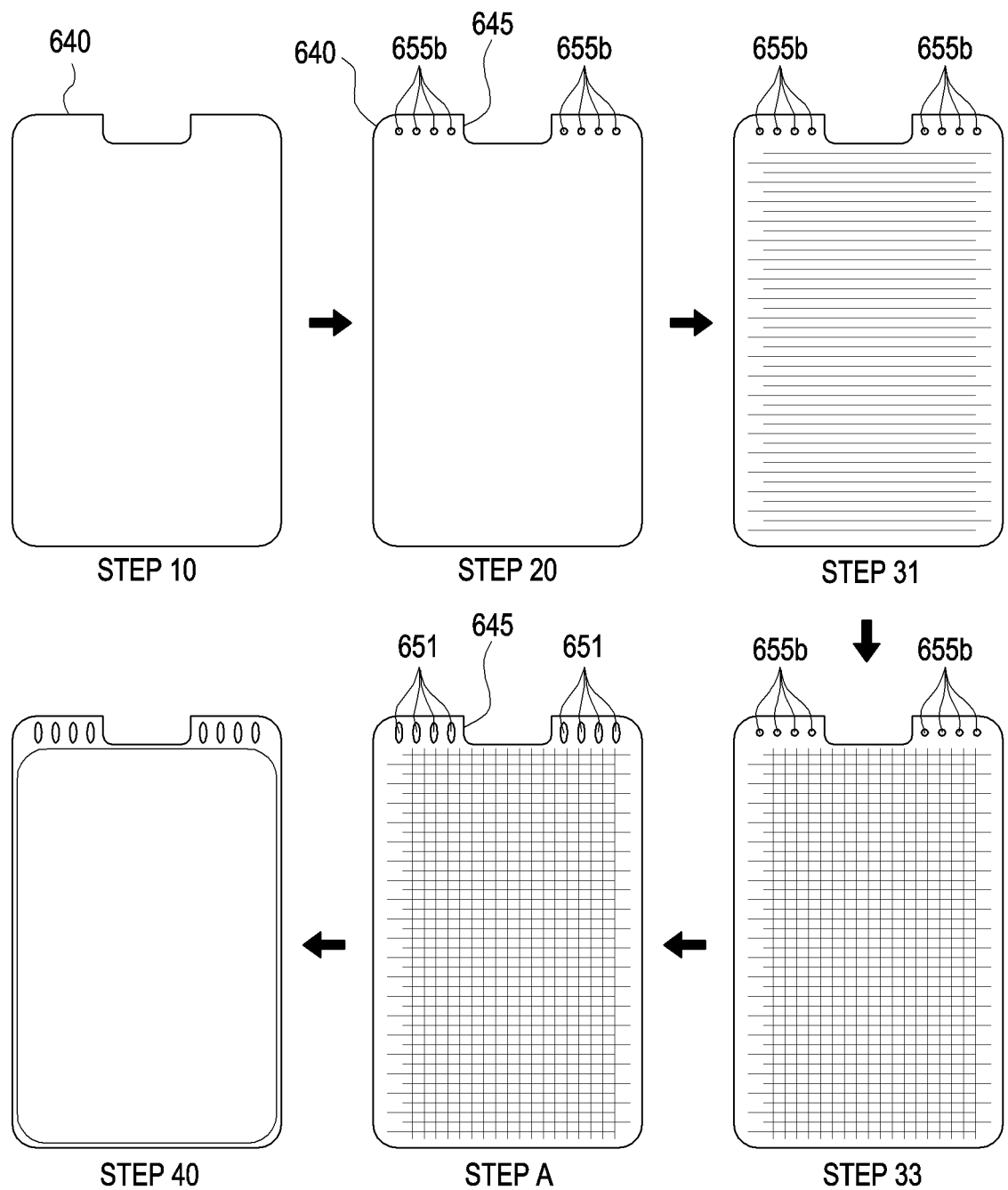

FIG. 15 is a flowchart of a process of forming a conductive via and an antenna pattern in a board, according to an embodiment. FIGS. 16A and 16B are diagrams schematically illustrating the process of FIG. 15, according to an embodiment.

The structure of the components of the display assembly 330 of FIGS. 8 to 14 may apply in whole or part to the structure of the components of the display assembly in the process of FIGS. 15, 16A, and 16B.

A display assembly 330 may include a transparent member 610, a display panel 630 including at least one display pixel 631a, a board 640 electrically connected with the at least one display pixel(s), an antenna 651 formed in one area of the board 640, and an antenna communication circuit 653 electrically connected with the antenna 651.

At step 10, the board 640 which is part of the display assembly 330 may be prepared.

The board 640 may be formed of a transparent insulating board (e.g., glass or a high-molecular film) and, when the board 640 is formed of a high-molecular film, may include a flexible board. The board 640 may be formed of a single PI-containing film or of a stack of a plurality of layers of PI-SiN-PI in the order thereof.

The board 640 may include a first area S1 which is formed of at least some layers of the display panel 630 and second areas S2 extending from the first area S1 to the outside of the display panel 630. After all of the steps are performed, the first area S1 may form a flat face and support the display panel 630. The second areas S2 may include an area disposed to extend to one side of the first area S1 (e.g., an upper direction +X of the display panel 630) and another area disposed to extend to another side of the first area S1 (e.g., a lower direction −X of the display panel 630).

The board 640 may be manufactured by performing subsequent processes with a designated shape prepared or by preparing a large film for forming multiple boards 640 and then cutting it to a designated shape as shown in FIG. 16.

Thereafter, at step 20, via holes 655a may be formed in the board 640. The via holes 655a of the board 640 may be formed through the board 640 to electrically connect the antenna 651 and the communication circuit 653.

When the board 640 is prepared with a designated shape, a notch 645 may be formed in the middle of an upper area of the board 640, and a plurality of via holes 655a may be formed in second areas S2 which are on both sides of the notch. The via holes 655a may be formed in a physical manner using a mechanical force or by etching using an acid. When a buffer layer (e.g., a SiN film) is disposed on the board 640, the step of forming the via holes 655a may be performed after the buffer layer is formed.

Then, at step 30, wiring and forming antennas for manufacturing the display panel 630 may be performed. Wiring may include a first wiring process which forms EM signal lines/scan lines at step 31 and a second wiring process which forms data lines at step 33. Forming antennas may include providing a conductive material in the via holes 655a and forming an antenna pattern which may be performed selectively at step 31 or 33. FIG. 16A illustrates an example in which step 10, step 30 (step 31, step A, and step 33), and step 40 are performed in the order thereof, and FIG. 16B illustrates an example in which step 10, step 30 (step 31, step 33, and step A), and step 40 are performed in the order thereof.

When the first wiring process (step 31) is performed, a plurality of scan lines SL may be formed and EM signal lines EML which are arranged in parallel with the scan lines SL may be formed to form the display panel 630 in the first area S1 of the board 640. The EM signl lines EML may be connected to their respective display pixels, and the step of further connecting a plurality of signal supply lines for supplying a reference voltage Vref for threshold voltage compensation, a power voltage VDD for driving, and supplying a ground voltage VSS to each display pixel may be performed.

When the antenna forming process proceeds along with the first wiring process (step 31), conductive vias may be formed and antennas may be arranged. The via holes 655a formed in the second areas S2 of the board 640 at step 20 may be filled with the same material (e.g., a conductive material) as the scan lines SL and EM signal lines EML, thereby forming conductive vias. Antennas 651 may be disposed on the surface where the conductive vias are formed. The antenna forming process may be performed by placing one mask with openings provided to allow the area where the lines are arranged to correspond to the area where the antennas are arranged and sputtering the top with the material (e.g., Ti, Mo, or Cu) forming the lines.

When the antennas 651 are electrically connected with the wireless communication circuit 653 not by via holes but in the form of a chip-on-film (COF) or chip-on-plastic (COP) form, the connection lines may be formed using a single mask.

The antennas 651 may include at least one radiating conductor which may be implemented in various forms (e.g., rods, meander lines, patches, or micro-strips). When there are provided a plurality of radiating conductors, the plurality of radiating conductors may be arrayed to form a designated pattern, thereby forming an antenna array.

A chip (e.g., an IC chip) in which part of the wireless communication circuit 653 is implemented may be disposed on the opposite surface of the surface where the radiating conductors are disposed or on one side of the area where the radiating conductors are disposed. The wireless communication circuit 653 may be electrically connected with the array of the plurality of radiating conductors and may be controlled by a processor to perform wireless communication using the array of radiating conductors.

After step 31, a second wiring process for forming data lines may be performed at step 33. If the antenna forming process (step 31a) has been performed at step 31, only the second wiring process may be performed. Unless the antenna forming process (step 31a) has been performed at step 31, the second wiring process may be performed together with the antenna forming process.

When the second wiring process (step 33) is performed, a plurality of data lines DL which cross the plurality of scan lines SL may be formed to form the display panel 630 in the first area S1 of the board 640. Pixels PX which correspond to the plurality of display pixels (e.g., red (R), green (G), and blue (B) pixels) may be formed and arranged at the crossings of the scan lines SL and the data lines DL. The step of placing transistors (e.g., gate electrodes, source electrodes, and drain electrodes) to connect with the wire layer in the first area S1 of the board 640 may be performed. The transistor may be connected with the power supply line and the capacitor to supply a drain current corresponding to the gate-source voltage to the organic light emitting diode which may then emit light using the drain current. The driving transistor may include a gate electrode, a source electrode, and a drain electrode, and the anode electrode of the organic light emitting diode may be connected to the drain electrode of the driving transistor.

When the antenna forming process proceeds along with the second wiring process (step 33), conductive vias may be formed and antennas may be arranged. The via holes 655a formed in the second areas S2 of the board 640 at step 20 may be filled with the same material (e.g., a conductive material) as the scan lines SL and EM signal lines EML, thereby forming conductive vias. Antennas 651 may be disposed on the surface where the conductive vias are formed. The antenna forming process may be performed by placing one mask with openings provided to allow the area where the lines are arranged to correspond to the area where the antennas are arranged and sputtering the top with the material (e.g., Ti, Mo, or Cu) forming the lines. The antenna forming process (step A) performed along with the first wiring process (step 31) may apply to the antenna forming process (step A) performed along with the second wiring process (step 33).

Thereafter, an organic LED and thin film encapsulation (TFE) process and an antenna covering process may be performed at step 40.

The organic LED and TFE process may be performed by a commonly known process. The antenna covering process may form at least one insulation layer on the antenna pattern to prevent corrosion to the antennas 651 formed on the board 640. The insulation layer forming process may be performed by placing one mask with openings in the areas where the antennas are arranged and injecting an insulation layer to the top of the antennas. The antennas may be protected against external impacts by covering the areas where the antennas are arranged and the surrounding areas by using a sealing layer which is used in the TFE process.

The via hole and antenna pattern forming process may be performed in the display process, not in the process which is performed on the main circuit board of the electronic device as conventional, thus excluding a separate process for forming a mounting space or antenna forming process which are required for the main circuit board.

According to an embodiment, a display assembly includes a display panel including one or more display pixels, a substrate electrically connected with the one or more display pixels and including a first area including at least some layers of the display panel and a second area extending from the first area to an outside of the display panel, and an antenna formed in at least part of the second area of the substrate.

The display assembly may further include a communication circuit electrically connected with the antenna.

The display assembly may further include a display driving circuit electrically connected with the display panel. The display driving circuit may be disposed in the second area.

The substrate may include a first surface and a second surface facing away from the first surface. The display assembly may further include a heat-radiating layer formed to face at least part of the second surface of the substrate. The display assembly may further include a second substrate different from the substrate or a shielding member disposed to be capable of thermal conduction between the communication circuit and the heat-radiating layer.

The substrate may include a first surface and a second surface facing away from the first surface. The display panel may be disposed on the first surface, and the communication circuit may be disposed on the second surface of the substrate.

The electronic device may further include a printed circuit board electrically connected with the substrate. The communication circuit may be disposed on the printed circuit board.

The display assembly may further include a transparent member formed on the display panel and covering at least part of the first area and the second area and a dielectric formed between the transparent member and the antenna.

The dielectric may include an epoxy material and have a permittivity ranging from 4.4 to 4.6.

The display assembly may further include a conductive member formed between the antenna and the display panel.

The substrate may include a first surface and a second surface facing away from the first surface. A ground connected with the antenna may be formed on at least part of the second surface of the substrate.

The antenna may be spaced apart from the display panel at a designated distance or more. The designated distance may be determined based on a wavelength of a use frequency of the antenna.

The antenna may include an array of radiating conductors. The array of radiating conductors may form a periodic pattern and may include patch-type radiating conductors or dipole-type radiating conductors.

The second area of the substrate may include a first extension area extending to an end of the first area and a second extension area extending to another end of the first area. The first extension area and the second extension area may be bent so that at least a portion thereof faces the first area.

The display assembly may further include a transparent member formed on the display panel and covering at least part of the first area and the second area. The antenna may be disposed to face the transparent member in the first extension area or the second extension area.

The antenna may be disposed in at least part of the bent portion of the first extension area or the second extension area.

According to an embodiment, an electronic device includes a display panel including one or more display pixels, a substrate electrically connected with the one or more display pixels and including a first area including at least some layers of the display panel and a second area extending from the first area to an outside of the display panel, an antenna formed in at least part of the second area of the substrate, and a communication circuit electrically connected with the antenna.

According to an embodiment, an electronic device includes a display panel including one or more display pixels, a transparent plate including an active area A1 configured to provide a user with an image and/or a video through the display panel and an inactive area A2 extending to a surrounding of the active area, a substrate including a first area connected with at least part of the display panel and a second area extending from the first area to an outside of the display panel, and an antenna formed in at least part of the second area of the substrate, wherein the antenna disposed in the second area may overlap at least part of the inactive area.

The electronic device may further include a communication circuit electrically connected with the antenna and disposed on a first printed circuit board different from the substrate. The first printed circuit board may be disposed to face at least part of the display panel.

The second area of the substrate may be bent and connected with the first printed circuit board. At least one of a power line or a signal line electrically connected with the antenna may be connected through the bent portion of the second area to the communication circuit.

The antenna may include an array of radiating conductors. The plurality of radiating conductors may be sized to correspond to a wavelength of a frequency band ranging from 6 GHz to 300 GHz included in a designated frequency.

As is apparent from the foregoing description, in an electronic device, a communication circuit or other circuit parts may be disposed on a board disposed inside a display assembly. Thus, more design flexibility may be obtained while maintaining the performance of wireless communication device.

In an electronic device, a board disposed inside a display assembly may be extended or bent, and a communication device may be disposed in the extended or bent portion. Therefore, an antenna may be placed in various positions, such as facing ahead, back, or to the side.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. A display assembly, comprising:
   a display panel including one or more display pixels;
   a substrate electrically connected with the one or more display pixels and including a first area stacked with at least one layer of the display panel and a second area extending from the first area to an outside of the display panel;
   an antenna formed in at least part of the second area of a first surface of the substrate; and
   a communication circuit disposed in the second area of a second surface facing in the opposite direction of the first surface of the substrate and electrically connected with the antenna through at least one via,
   wherein the first area of the substrate forms a flat surface and supports the display panel,
   wherein the second area of the substrate includes a first extension area extending to a side of the first area, and wherein the first extension area is bent such that at least a portion thereof faces the first area.

2. The display assembly of claim 1, further comprising:
a display driving circuit electrically connected with the display panel, wherein the display driving circuit is disposed in the second area.

3. The display assembly of claim 1, wherein the display assembly further comprises:
a heat-radiating layer configured to be formed to face at least part of the second surface of the substrate; and
a second substrate different from the substrate or a shielding member disposed to be capable of thermal conduction between the communication circuit and the heat-radiating layer.

4. The display assembly of claim 1, wherein the display panel is disposed on the first surface.

5. The display assembly of claim 1, further comprising:
a transparent member configured to be formed on the display panel and cover at least part of the first area and at least part of the second area; and
a dielectric formed between the transparent member and the antenna.

6. The display assembly of claim 5, wherein the dielectric includes an epoxy material and has a permittivity ranging from about 4.4 to 4.6.

7. The display assembly of claim 1, further comprising:
a conductive member formed between the antenna and the display panel.

8. The display assembly of claim 1, wherein the substrate includes a first surface and a second surface facing away from the first surface, and
wherein a ground connected with the antenna is formed on at least part of the second surface of the substrate.

9. The display assembly of claim 1, wherein the antenna is spaced apart from the display panel at a designated distance or more, and wherein the designated distance is determined based on a wavelength of a use frequency of the antenna.

10. The display assembly of claim 9, wherein the antenna includes an array of radiating conductors, and wherein the array of the radiating conductors are configured to form a periodic pattern and includes patch-type radiating conductors or dipole-type radiating conductors.

11. The display assembly of claim 1, wherein the second area of the substrate includes a second extension area extending to another side of the first area.

12. The display assembly of claim 11, further comprising:
a transparent member formed on the display panel and covering at least part of the first area and the second area, wherein the antenna is disposed to face the transparent member in the first extension area or the second extension area.

13. The display assembly of claim 11, wherein the antenna is disposed in at least part of the bent portion of the first extension area or the second extension area.

14. An electronic device, comprising:
a display panel including one or more display pixels;
a transparent plate including an active area configured to provide a user with an image and/or a video through the display panel and an inactive area extending to a surrounding of the active area;
a substrate including a first area connected with at least part of the display panel and a second area extending from the first area to an outside of the display panel;
an antenna disposed in at least part of the second area of a first surface of the substrate; and
a communication circuit disposed in the second area of a second surface facing in the opposite direction of the first surface of the substrate and electrically connected with the antenna through at least one via,
wherein the antenna disposed in the second area overlaps at least part of the inactive area,
wherein the first area of the substrate forms a flat surface and supports the display panel,
wherein the second area of the substrate includes a first extension area extending to a side of the first area, and
wherein the first extension area is bent such that at least a portion thereof faces the first area.

15. The electronic device of claim 14, wherein the antenna includes an array of radiating conductors, and wherein the array of radiating conductors are sized to correspond to a wavelength of a frequency band ranging from about 6 GHz to 300 GHz included in a designated frequency.

* * * * *